(12) United States Patent
 Mehregany

(10) Patent No.: US 11,913,893 B2
(45) Date of Patent: *Feb. 27, 2024

(54) SMART PACKAGING FOR IMPROVED MEDICATION REGIMEN COMPLIANCE

(71) Applicant: QuantaEd, LLC, San Diego, CA (US)

(72) Inventor: Mehran Mehregany, San Diego, CA (US)

(73) Assignee: QuantaEd, LLC, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/074,382

(22) Filed: Dec. 2, 2022

(65) Prior Publication Data
US 2023/0111861 A1    Apr. 13, 2023

Related U.S. Application Data

(63) Continuation of application No. 17/468,217, filed on Sep. 7, 2021, which is a continuation of application (Continued)

(51) Int. Cl.
*G01R 27/08* (2006.01)
*A61J 1/03* (2023.01)
(Continued)

(52) U.S. Cl.
CPC ............ *G01N 27/041* (2013.01); *A61J 1/035* (2013.01); *A61J 7/0076* (2013.01); *A61J 7/04* (2013.01);
(Continued)

(58) Field of Classification Search
CPC ...... G01N 27/041; G01N 27/02; G01N 27/06; G01N 29/0672; G01N 27/20;
(Continued)

(56) References Cited

U.S. PATENT DOCUMENTS

| | | |
|---|---|---|
| D139,383 S | 11/1944 | Lampl |
| 2,885,110 A | 5/1959 | Tregilgas |

(Continued)

FOREIGN PATENT DOCUMENTS

| | | |
|---|---|---|
| AU | 2009238236 A1 | 12/2009 |
| CN | 101802648 A | 8/2010 |

(Continued)

OTHER PUBLICATIONS

Advisory Action (PTOL-303) received for U.S. Appl. No. 14/879,874, dated Aug. 1, 2018, 3 pages.
(Continued)

*Primary Examiner* — Raul J Rios Russo
(74) *Attorney, Agent, or Firm* — Kaplan Breyer Schwarz, LLP

(57) ABSTRACT

The present disclosure enables apparatus and methods for tracking medications and/or product units via smart-packaging concepts. Embodiments include sensors that monitor the state of a blister-card package having an unpatterned lidding film by measuring the impedance of each dispensing region of the lidding film that defines a portion of a blister. In some embodiments, the impedance is measured via a plurality of contact points arranged on opposite sides of each dispensing region, where the contact points are resistively or capacitively coupled with the lidding film. In some embodiments, the impedance map of a measurement region on the blister card is derived via electrical impedance tomography or electrical resistance tomography, where the measurement region includes a plurality of dispensing regions.

24 Claims, 19 Drawing Sheets

Related U.S. Application Data

No. 16/825,981, filed on Mar. 20, 2020, now Pat. No. 11,193,903, which is a continuation of application No. 16/156,603, filed on Oct. 10, 2018, now Pat. No. 10,634,633.

(60) Provisional application No. 62/570,328, filed on Oct. 10, 2017.

(51) Int. Cl.

| | | |
|---|---|---|
| *A61J 7/00* | (2006.01) | |
| *A61J 7/04* | (2006.01) | |
| *G01N 27/02* | (2006.01) | |
| *G01N 27/04* | (2006.01) | |
| *G01N 27/06* | (2006.01) | |
| *G01N 27/07* | (2006.01) | |
| *G01N 29/06* | (2006.01) | |
| *G01N 27/20* | (2006.01) | |
| *H01L 21/66* | (2006.01) | |

(52) U.S. Cl.
CPC ............ *G01N 27/02* (2013.01); *G01N 27/06* (2013.01); *G01N 27/07* (2013.01); *G01N 29/0672* (2013.01); *A61J 2200/30* (2013.01); *A61J 2200/70* (2013.01); *G01N 27/20* (2013.01); *G01N 2291/0237* (2013.01); *G01N 2291/0258* (2013.01); *H01L 22/14* (2013.01); *H01L 2224/45015* (2013.01); *H01L 2224/45099* (2013.01); *H01L 2924/00014* (2013.01)

(58) Field of Classification Search
CPC ... G01N 2291/0237; G01N 2291/0258; G01N 27/07; A61J 1/035; A61J 7/0076; A61J 7/04; A61J 2200/30; A61J 2200/70; H01L 22/14; H01L 2224/45015; H01L 2224/45099; H01L 2924/00014; B82Y 15/00; B82Y 30/00; B82Y 35/00
USPC ... 324/76.11–76.83, 459, 600, 649, 691, 693
See application file for complete search history.

(56) References Cited

U.S. PATENT DOCUMENTS

| | | |
|---|---|---|
| 3,243,081 A | 3/1966 | Schmank |
| 3,854,625 A | 12/1974 | Kuebler |
| D253,722 S | 12/1979 | Allen |
| D257,584 S | 12/1980 | Finkel |
| D275,833 S | 10/1984 | Malpass |
| 4,616,316 A | 10/1986 | Hanpeter et al. |
| 4,617,557 A | 10/1986 | Gordon |
| 4,660,991 A | 4/1987 | Simon |
| D305,960 S | 2/1990 | Wolff |
| D307,421 S | 4/1990 | Tedham et al. |
| D311,774 S | 10/1990 | Lax |
| D324,819 S | 3/1992 | Eisenberg |
| D339,742 S | 9/1993 | Walchek et al. |
| 5,267,650 A | 12/1993 | Gilbilisco |
| 5,313,439 A | 5/1994 | Albeck |
| D358,546 S | 5/1995 | Walchek et al. |
| D358,762 S | 5/1995 | Walchek et al. |
| 5,412,372 A | 5/1995 | Parkhurst et al. |
| D398,521 S | 9/1998 | Coe |
| D399,134 S | 10/1998 | Lidle, Jr. |
| 5,852,590 A | 12/1998 | De La Huerga |
| D411,445 S | 6/1999 | Anderson |
| D414,106 S | 9/1999 | Anderson |
| D453,354 S | 2/2002 | Ikenaga et al. |
| 6,411,567 B1 | 6/2002 | Niemiec et al. |
| D460,690 S | 7/2002 | Doerschlag |
| 6,839,304 B2 | 1/2005 | Niemiec et al. |
| D514,308 S | 2/2006 | Wahl et al. |
| D516,801 S | 3/2006 | Jones et al. |
| D518,178 S | 3/2006 | Christiansen |
| 7,028,723 B1 | 4/2006 | Alouani et al. |
| 7,081,807 B2 | 7/2006 | Lai |
| 7,113,101 B2 | 9/2006 | Petersen et al. |
| 7,181,807 B2 | 2/2007 | Oatway |
| D541,039 S | 4/2007 | Stugelmeyer |
| 7,258,005 B2 | 8/2007 | Nyce |
| D553,738 S | 10/2007 | Simonson |
| D585,638 S | 2/2009 | Skedelius |
| 7,502,666 B2 | 3/2009 | Siegel et al. |
| D593,316 S | 6/2009 | Ruwiel |
| D606,393 S | 12/2009 | Easterbrook et al. |
| 7,630,788 B1 | 12/2009 | Reese |
| D612,594 S | 3/2010 | Wade et al. |
| D622,499 S | 8/2010 | Sprada et al. |
| 7,821,404 B2 | 10/2010 | Walker et al. |
| 7,928,835 B1 | 4/2011 | Jovanov et al. |
| D640,920 S | 7/2011 | Giraud et al. |
| 8,025,149 B2 | 9/2011 | Sterry et al. |
| 8,120,492 B2 | 2/2012 | Scharfeld et al. |
| 8,152,020 B2 | 4/2012 | Flowers et al. |
| D660,428 S | 5/2012 | Hohl |
| D663,110 S | 7/2012 | Marwah et al. |
| D663,112 S | 7/2012 | Fulmer Mason |
| D665,571 S | 8/2012 | Tello |
| D673,360 S | 1/2013 | Denzinger |
| D679,086 S | 4/2013 | Liguori |
| D689,688 S | 9/2013 | Horn |
| D693,999 S | 11/2013 | Alexander |
| 8,583,281 B2 | 11/2013 | Bear et al. |
| D694,906 S | 12/2013 | Priebe et al. |
| 8,733,432 B2 | 5/2014 | Labrecque |
| 8,762,084 B2 | 6/2014 | Gao et al. |
| D711,882 S | 8/2014 | Yeo |
| D716,868 S | 11/2014 | Jansen et al. |
| 8,878,654 B2 | 11/2014 | Cohen-Alloro et al. |
| D719,216 S | 12/2014 | Jansen et al. |
| 8,960,440 B1 | 2/2015 | Kronberg |
| 8,963,710 B2 | 2/2015 | Huang et al. |
| D727,903 S | 4/2015 | Madsen |
| 9,070,063 B2 | 6/2015 | Carrender |
| D736,404 S | 8/2015 | Priebe et al. |
| 9,233,051 B2 | 1/2016 | Tufi |
| 9,387,154 B2 | 7/2016 | Aggarwal et al. |
| D787,812 S | 5/2017 | Ganesan et al. |
| 9,717,654 B2 | 8/2017 | Dickie et al. |
| 9,717,655 B2 | 8/2017 | Nova et al. |
| 9,770,390 B2 | 9/2017 | Aggarwal et al. |
| 10,013,534 B2 | 7/2018 | Blochet et al. |
| 10,083,594 B2 | 9/2018 | Mehregany et al. |
| 10,278,287 B2 | 4/2019 | Wilson et al. |
| 10,282,971 B2 | 5/2019 | Mehregany |
| 10,285,904 B2 | 5/2019 | Ahmadi |
| 10,375,847 B2 | 8/2019 | Mehregany |
| 10,431,070 B2 | 10/2019 | Mehregany |
| 10,565,855 B2 | 2/2020 | Mehregany |
| 10,634,633 B2 | 4/2020 | Mehregany |
| 10,650,661 B2 | 5/2020 | Mehregany |
| 10,729,028 B2 | 7/2020 | Mehregany |
| 11,129,770 B2 | 9/2021 | Learmonth et al. |
| 11,193,903 B2 | 12/2021 | Mehregany |
| 2005/0162979 A1 | 7/2005 | Ostergaard et al. |
| 2005/0252924 A1 | 11/2005 | Pieper et al. |
| 2007/0012592 A1 | 1/2007 | Bertsch et al. |
| 2007/0235366 A1 | 10/2007 | Desai et al. |
| 2009/0199346 A1 | 8/2009 | Brawner |
| 2009/0283438 A1 | 11/2009 | Bourque |
| 2010/0006441 A1 | 1/2010 | Renaud et al. |
| 2010/0089789 A1 | 4/2010 | Rosenbaum et al. |
| 2010/0089791 A1 | 4/2010 | Rosenbaum et al. |
| 2010/0094455 A1 | 4/2010 | Dehlin et al. |
| 2010/0147733 A1 | 6/2010 | Pabari et al. |
| 2011/0100862 A1 | 5/2011 | Turkington et al. |
| 2011/0155602 A1 | 6/2011 | Sterry et al. |
| 2012/0024889 A1 | 2/2012 | Robertson et al. |

(56) References Cited

U.S. PATENT DOCUMENTS

| | | |
|---|---|---|
| 2012/0056000 A1 | 3/2012 | Shores |
| 2012/0145573 A1 | 6/2012 | Scharfeld et al. |
| 2012/0330684 A1 | 12/2012 | Jacobs et al. |
| 2013/0085365 A1 | 4/2013 | Marashdeh et al. |
| 2013/0126379 A1 | 5/2013 | Medhal et al. |
| 2013/0222135 A1 | 8/2013 | Stein et al. |
| 2013/0236635 A1 | 9/2013 | Leuenberger et al. |
| 2013/0285681 A1* | 10/2013 | Wilson ................. H05K 3/1275 324/693 |
| 2013/0319902 A1 | 12/2013 | Tufi |
| 2013/0330684 A1 | 12/2013 | Dillon et al. |
| 2014/0055267 A1 | 2/2014 | Rothschild |
| 2014/0118010 A1 | 5/2014 | Fan et al. |
| 2014/0251850 A1 | 9/2014 | Huang et al. |
| 2014/0255899 A1 | 9/2014 | Poullain |
| 2014/0288942 A1 | 9/2014 | Blochet |
| 2014/0341411 A1 | 11/2014 | Mohindra et al. |
| 2015/0164741 A1 | 6/2015 | Wilson et al. |
| 2015/0224026 A1 | 8/2015 | Davidson et al. |
| 2015/0286852 A1 | 10/2015 | Sengstaken, Jr. |
| 2016/0000657 A1 | 1/2016 | Dickie et al. |
| 2016/0074283 A1 | 3/2016 | Aggarwal et al. |
| 2016/0103085 A1* | 4/2016 | Mehregany ............. A61J 1/035 361/679.01 |
| 2016/0128906 A1* | 5/2016 | Baarman ................... A61J 7/04 221/13 |
| 2016/0158109 A1 | 6/2016 | Nova et al. |
| 2016/0367435 A1 | 12/2016 | Ahmadi |
| 2017/0035659 A1 | 2/2017 | Balakier et al. |
| 2017/0194961 A1 | 7/2017 | Chang et al. |
| 2017/0283151 A1 | 10/2017 | Stormer et al. |
| 2017/0294105 A1 | 10/2017 | Mehregany et al. |
| 2018/0044060 A1 | 2/2018 | Leahy |
| 2018/0060657 A1 | 3/2018 | Stuck |
| 2018/0136155 A1* | 5/2018 | Balthes ................. G01N 27/041 |
| 2019/0107501 A1* | 4/2019 | Mehregany ........... A61J 7/0076 |
| 2019/0117509 A1 | 4/2019 | Hiraizumi et al. |
| 2019/0197872 A1 | 6/2019 | Mehregany |
| 2019/0201286 A1 | 7/2019 | Learmonth et al. |
| 2019/0223312 A1* | 7/2019 | Mehregany ............. B65B 57/10 |
| 2019/0244510 A1 | 8/2019 | Mehregany |
| 2020/0085694 A1 | 3/2020 | Patel et al. |
| 2020/0256815 A1 | 8/2020 | Mehregany |
| 2020/0383871 A1* | 12/2020 | Mehregany ............. A61J 1/035 |
| 2021/0239545 A1* | 8/2021 | Banica ................... G01B 7/003 |
| 2021/0404982 A1 | 12/2021 | Mehregany |
| 2022/0000716 A1 | 1/2022 | Learmonth et al. |

FOREIGN PATENT DOCUMENTS

| | | |
|---|---|---|
| CN | 102322920 A | 1/2012 |
| CN | 103235013 A | 8/2013 |
| CN | 103249653 A | 8/2013 |
| CN | 104302555 A | 1/2015 |
| EP | 1923034 A1 | 5/2008 |
| EP | 2067718 A1 | 6/2009 |
| GB | 2463054 A | 3/2010 |
| JP | 2013-529095 A | 7/2013 |
| JP | 2015-516823 A | 6/2015 |
| JP | 2015-520702 A | 7/2015 |
| JP | 2016-518882 A | 6/2016 |
| WO | 94/07184 A1 | 3/1994 |
| WO | 2008/079090 A1 | 7/2008 |
| WO | 2009/116108 A1 | 9/2009 |
| WO | 2010/045227 A1 | 4/2010 |
| WO | 2010/108838 A1 | 9/2010 |
| WO | 2012/111034 A1 | 8/2012 |
| WO | 2013/126897 A1 | 8/2013 |
| WO | 2013/159198 A1 | 10/2013 |
| WO | 2014/145218 A2 | 9/2014 |
| WO | 2015/008528 A1 | 1/2015 |
| WO | 2015/131224 A1 | 9/2015 |
| WO | 2015/191159 A2 | 12/2015 |
| WO | 2016/118605 A1 | 7/2016 |
| WO | 2018/156810 A1 | 8/2018 |

OTHER PUBLICATIONS

Advisory Action (PTOL-303) received for U.S. Appl. No. 15/170,121, dated Aug. 3, 2018, 4 pages.

Advisory Action received for U.S. Appl. No. 16/179,287, dated Oct. 10, 2019, 3 pages.

Applicant Initiated Interview Summary (PTOL-413) received for U.S. Appl. No. 14/879,874, dated Mar. 13, 2019, 3 pages.

Applicant Initiated Interview Summary received for U.S. Appl. No. 14/879,874, dated Jul. 5, 2018, 3 pages.

Applicant Initiated Interview Summary received for U.S. Appl. No. 15/170,121, dated Jul. 5, 2018, 3 pages.

Applicant Initiated Interview Summary received for U.S. Appl. No. 16/179,287, dated Oct. 3, 2019, 3 pages.

Applicant Initiated Interview Summary received for U.S. Appl. No. 29/614,053, dated Oct. 2, 2018.

Ariel Bogle, "Soon Your Medicine Bottle Could Remind You to Take Your Pills", "Future Tense—The Citizen's Guide to the Future", Aug. 19, 2013, Publisher: ASU I New America I Slate.

Authorized Officer Shane Thomas, International Search Report and Written Opinion issued in International Patent Application No. PCT/US18/55267 dated Dec. 11, 2018.

Authorized Officer: Gkama, Alexandra, International Search Report and Written Opinion issued in PCT patent application No. PCT/US2018/019289, dated May 16, 2018, 11 pp.

Authorized Officer: Melissa Koval, "International Preliminary Report on Patentability" dated Sep. 1, 2017 in PCT Application No. PCT/US16/55516.

Cielo Pill Holders. Link: https://www.cielopillholders.com/products/slim-single-chamber-pill-holder. Visited Dec. 4, 2018. Slim Single Chamber Pill Holder. (Year: 2018).

Communication about intention to grant a European patent dated Feb. 11, 2020 for EP Application No. 16791135.3.

Communication about intention to grant a European patent dated Jul. 13, 2020 for EP Application No. 17719957.7.

Communication about intention to grant a European patent dated May 9, 2019 for EP Application No. 16791136.1.

Communication issued in European patent application No. 20731344. 6, dated Jan. 27, 2022, 3 pp.

Decision to grant a European patent dated Jun. 12, 2020, 2 pages.

Decision to grant a European patent dated Nov. 7, 2019 for EP Application 16791136.

Decision to grant a European patent dated Nov. 26, 2020 for EP Application No. 17719957.7.

English Translation of Office Action issued in Japanese Patent Application No. 2018-538051 dated Nov. 25, 2019.

English Translation of Office Action issued in Japanese Patent Application No. 2018-552841 dated Mar. 1, 2021.

Examiner initialed interview summary (PTOL-413B) received for U.S. Appl. No. 14/879,874, dated Jun. 3, 2019, 2 pages.

Examiner initialed interview summary (PTOL-413B) received for U.S. Appl. No. 29/614,055, dated Dec. 20, 2018, 1 page.

Examiner initialed interview summary received for U.S. Appl. No. 16/179,287, dated Oct. 31, 2019, 1 pages.

Examiner initialed interview summary received for U.S. Appl. No. 16/290,656, dated Jul. 30, 2019, 1 page.

Examiner initialed interview summary received for U.S. Appl. No. 16/360,332, dated Apr. 14, 2020, 2 pages.

Examiner initialed interview summary (PTOL-413B) received for U.S. Appl. No. 15/170,121, dated Aug. 3, 2018, 1 pages.

English Translation of Office Action issued in related JP Patent Application No. 2018-538051 dated Nov. 25, 2019.

"Non-Final Office Action", U.S. Appl. No. 14/879,874, dated Oct. 10, 2017.

Office Action (and English Translation thereof) issued in Japanese Patent Application No. 2019-545769 dated Dec. 6, 2021.

"Notice of Allowance" issued in related U.S. Appl. No. 15/223,779, dated Apr. 19, 2018.

(56) References Cited

OTHER PUBLICATIONS

Office Action issued in counterpart Chinese patent application No. 201680067351.1, dated Apr. 21, 2020, 12 pp.
Office Action issued in counterpart Japanese patent application No. 2018-538051, dated Apr. 27, 2020, 6 pp.
Office Action issued in Japanese patent application No. 2020-143416, dated Nov. 8, 2021, 4 pp. w/ translation.
"Final Rejection" issued in related U.S. Appl. No. 14/879,874 dated May 14, 2018.
"Non-Final Rejection" issued in U.S. Appl. No. 15/170,121, dated Nov. 20, 2017.
Office Action issued in counterpart Japanese patent application No. 2018-538053, dated Mar. 2, 2020, 4 pp.
Office Action issued in counterpart Japanese patent application No. 2018-538053, dated Aug. 26, 2019, 11 pp.
Notice of Allowance issued in U.S. Appl. No. 16/825,981, dated Oct. 18, 2021, 10 pp.
Office Action issued in counterpart Chinese patent application No. 201780030375.4, dated Jul. 3, 2019, 14 pp.
Office Action issued in Chinese patent application No. 202010139111.6, dated Feb. 7, 2022, 23 pp. w/ translation.
Office Action issued in counterpart Japanese patent application No. 2018-552841, dated Jun. 7, 2021, 11 pp. w/ translation.
Final Office Action received for U.S. Appl. No. 14/879,874, dated May 14, 2018, 35 pages.
Final Office Action received for U.S. Appl. No. 16/360,332, dated Feb. 5, 2020.
Final Rejection dated May 29, 2018 for U.S. Appl. No. 15/170,121.
Final Rejection received for U.S. Appl. No. 16/179,287, dated Aug. 1, 2019, 11 pages.
Final Rejection received for U.S. Appl. No. 29/614,053, dated Jan. 10, 2019, 5 pages.
International Search Report and Written Opinion issued in PCT Patent Application PCT/US2020/033820 dated Sep. 10, 2020.
Non-Final Office Action dated Jun. 7, 2021 for U.S. Appl. No. 16/825,981.
Todd O'Connor, "mTouch (TM) Projected Capacitive Touch Screen Sensing Theory of Operation", ISBN:978-1-60932-466-7, Publisher: Microchip Technology Inc., vol. DS93064A, pp. 1-16, Jan. 5, 2010, US.
Yang et al., "A Health-IoT Platform Based on the Integration of Intelligent Packaging, Unobtrusive Bio-Sensor and Intelligent Medicine Box", "Transactions on Industrial Informatics", 2014, pp. 1-13, Publisher: IEEE; DOI: 10.1109 TII.2014.2307795.
Yongjia (Allen) Yao, "Wearable Sensor Scanner using Electrical Impedance Tomography", Sep. 26, 2012, Publisher: University of Bath, Country: UK.
Non-Final Office Action dated Oct. 27, 2022 for U.S. Appl. No. 17/471,550.
Office Action issued in Korean patent application No. 10-2019-7027721, dated Oct. 11, 2022, 4 pp. w/ translation.
Non-Final Office Action received for U.S. Appl. No. 14/879,874, dated Oct. 10, 2017, 29 pages.
Non-Final Office Action received for U.S. Appl. No. 15/170,121, dated Nov. 20, 2017, 17 pages.
Non-Final Office Action received for U.S. Appl. No. 15/223,779, dated Sep. 8, 2017, 13 pages.
Non-Final Office Action received for U.S. Appl. No. 16/360,332, dated Oct. 4, 2019, 32 pages.
Non-Final Rejection dated Feb. 8, 2019 for U.S. Appl. No. 16/179,287.
Non-Final Rejection dated Feb. 17, 2022 for U.S. Appl. No. 17/199,838 Non-Final Rejection dated Feb. 17, 2022 for U.S. Appl. No. 17/199,838.
Non-Final Rejection dated Jul. 12, 2022 for U.S. Appl. No. 16/434,981.
Non-Final Rejection dated Jun. 16, 2021 for U.S. Appl. No. 16/333,021.
Non-Final Rejection dated Nov. 1, 2022 for U.S. Appl. No. 17/468,217.
Non-Final Rejection dated Oct. 10, 2017 for U.S. Appl. No. 14/879,874.
Non-Final Rejection dated Sep. 17, 2020 for U.S. Appl. No. 16/422,284.
Non-Final Rejection received for U.S. Appl. No. 14/879,874, dated Feb. 26, 2019, 40 pages.
Non-Final Rejection received for U.S. Appl. No. 15/170,121, dated Mar. 7, 2019, 21 pages.
Non-Final Rejection received for U.S. Appl. No. 16/100,430, dated Jan. 25, 2019, 7 pages.
Non-Final Rejection received for U.S. Appl. No. 16/179,287, dated Feb. 8, 2019, 9 Pages.
Non-Final Rejection received for U.S. Appl. No. 16/290,656, dated Jun. 28, 2019, 6 pages.
Notice of Allowance and Fees Due (PTOL-85) dated Aug. 9, 2018 for U.S. Appl. No. 15/223,779.
Notice of Allowance and Fees Due (PTOL-85) dated Dec. 14, 2020 for U.S. Appl. No. 16/422,284.
Notice of Allowance and Fees Due (PTOL-85) received for U.S. Appl. No. 14/879,874, dated Jun. 3, 2019, 19 pages.
Notice of Allowance and Fees Due (PTOL-85) received for U.S. Appl. No. 15/170,121, dated Apr. 30, 2019, 14 pages.
Notice of Allowance and Fees Due (PTOL-85) received for U.S. Appl. No. 16/100,430, dated Mar. 13, 2019, 8 pages.
Notice of Allowance and Fees Due (PTOL-85) received for U.S. Appl. No. 29/614,049, dated Jan. 10, 2019, 5 pages.
Notice of Allowance and Fees Due (PTOL-85) received for U.S. Appl. No. 29/614,053, dated Feb. 21, 2019, 5 pages.
Notice of Allowance and Fees Due (PTOL-85) received for U.S. Appl. No. 29/614,055, dated Dec. 20, 2018, 9 pages.
Notice of Allowance dated Aug. 5, 2021 for U.S. Appl. No. 16/333,021.
Notice of Allowance dated Oct. 18, 2021 for U.S. Appl. No. 16/825,981.
Notice of Allowance received for U.S. Appl. No. 15/223,779, dated Apr. 19, 2018, 8 pages.
Notice of Allowance received for U.S. Appl. No. 15/223,779, dated Aug. 9, 2018, 09 pages.
Notice of Allowance received for U.S. Appl. No. 16/156,603, dated Feb. 21, 2020.
Notice of Allowance received for U.S. Appl. No. 16/179,287, dated Oct. 31, 2019, 9 pages.
Notice of Allowance received for U.S. Appl. No. 16/290,656, dated Jul. 30, 2019, 9 pages.
Notice of Allowance received for U.S. Appl. No. 16/360,332, dated Apr. 14, 2020, 18 pages.
Notice of Allowance received for U.S. Appl. No. 16/385,176, dated Apr. 10, 2020, 6 pages.
Notice of Allowance received for U.S. Appl. No. 16/385,176, dated Mar. 17, 2020.
Notice of Preliminary Rejection issued in counterpart Korean patent application No. 10-2018-7030189, dated Jul. 19, 2021, 6 pp. w. translation.
Office Action issued in Korean patent application No. 10-2018-7013170, dated Feb. 19, 2022, 11 pp. w/ translation.
Office Action received for European Patent Application No. 16791135.3, dated Mar. 29, 2019, 4 pages.
Office Action received for European Patent Application No. 17719957.7, dated Aug. 5, 2019, 7 pages.
Officer: Hong Djien Ong, "International Search Report and The Written Opinion", International Patent Application No. PCT/US2017/025302, Search Completed Jun. 8, 2017, 12 pp.
Officer: Jean Sommer, "International Search Report and Written Opinion", PCT/US2016/055516, Completed Jan. 5, 2017.
Officer: Ioannis Kousouretas, "International Search Report and Written Opinion", PCT/US2016/055535, Completed Jan. 16, 2017.
Office Action issued in European patent application No. 18709231.7, dated May 27, 2022, 5 pp.
Office Action issued in counterpart European patent application No. 17719957.7, dated Aug. 5, 2019, 7 pp.
Ramani Duraiswami et al., "Efficient 2D and 3D electrical impedance tomography using dual reciprocity boundary element techniques", "Engineering Analysis with Boundary Elements", Abstract only, Sep. 21, 1998, Publisher:Elsevier B.V., 13-31, vol. 22, Iss 1, https://doi.org/10.1016/S0955-7997(98)00028-9.
Requirement for Restriction/Election dated May 17, 2021 for U.S. Appl. No. 16/333,021.

(56) References Cited

OTHER PUBLICATIONS

Requirement for Restriction/Election dated Oct. 26, 2021 for U.S. Appl. No. 16/434,981.
Sarkar et al., "Efficient 2D and 3D electrical impedance tomography using dual reciprocity boundary element techniques", "Engineering Analysis with Boundary Elements", Jul. 1998, Publisher: Research Gate.
Silva et al., "Influence of current injection pattern and electric potential measurement strategies in electrical impedance tomography", Mar. 2, 2016, Publisher: Elsevier Ltd., Publication: "Control Engineering Practice", http://dx.doi.org/10.1016/j.conengprac.2016.03.003, Country: BR.
SMRxT Realtime Medication Adherence, 2012-2014, Publisher: SMRxT Inc.; http://smrxl.com/index.php.
The Most Accurate Smart Blister in the World, "med-ic Smart Label", 2011, Publisher: IMC Information Mediary Corp.
Advisory Action (PTOL-303) dated Jan. 20, 2023 for U.S. Appl. No. 16/434,981.
Final Rejection dated Nov. 14, 2022 for U.S. Appl. No. 16/434,981.
List of references Mailed on Dec. 22, 2022 for U.S. Appl. No. 17/471,550.
List of references Mailed on Dec. 27, 2022 for U.S. Appl. No. 17/468,217.
Notice of Allowance and Fees Due (PTOL-85) dated Dec. 27, 2022 for U.S. Appl. No. 17/468,217.
Notice of Allowance and Fees Due (PTOL-85) dated May 4, 2022 for U.S. Appl. No. 17/199,838.
Non-Final Rejection dated Feb. 17, 2023 for U.S. Appl. No. 16/434,981.
Examiner Interview Summary Record (PTOL-413) dated May 11, 2023 for U.S. Appl. No. 16/434,981, 2 page(s).
Final Rejection dated Aug. 17, 2023 for U.S. Appl. No. 16/434,981, 20 page(s).

* cited by examiner

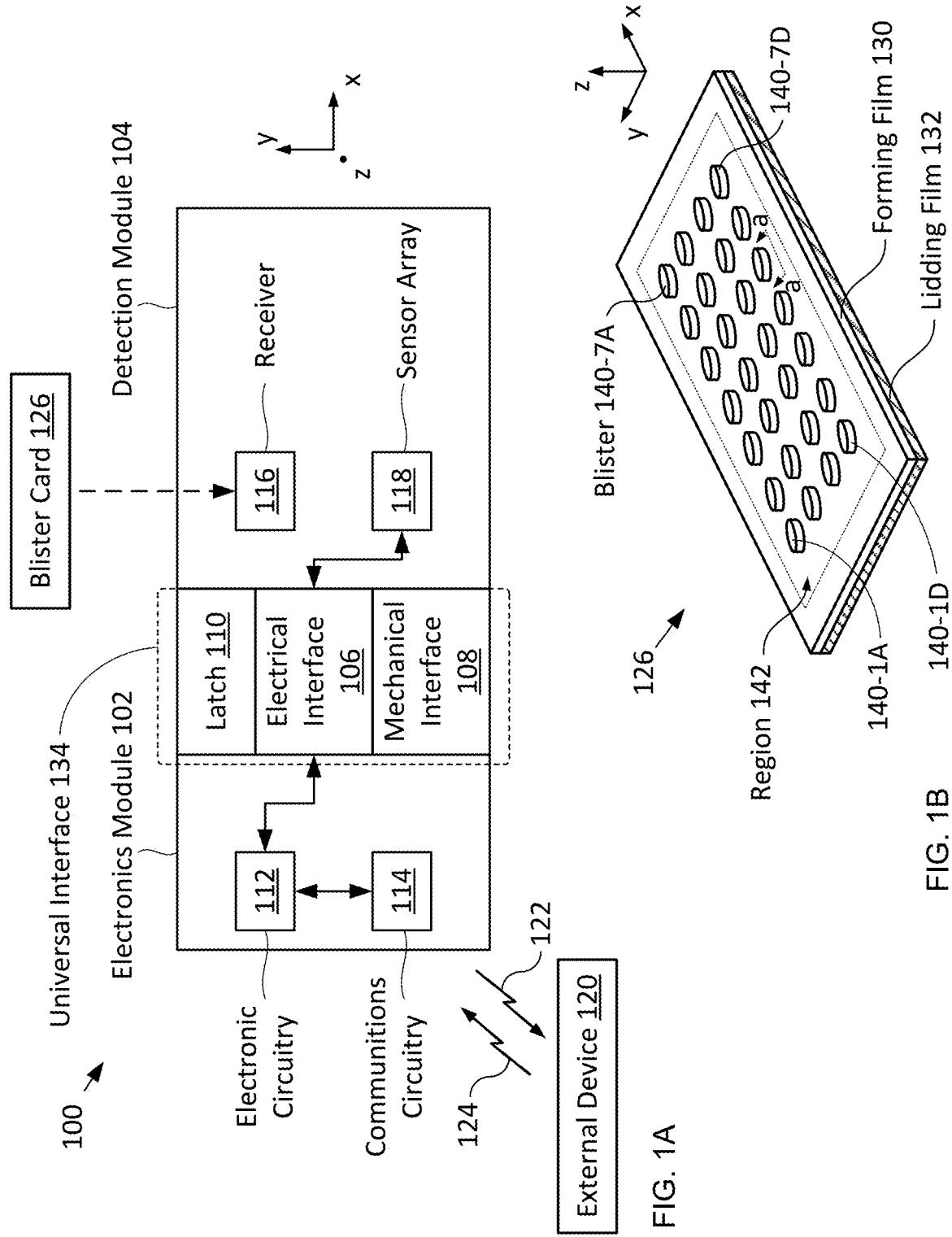

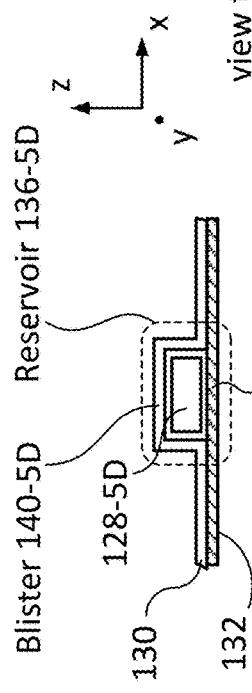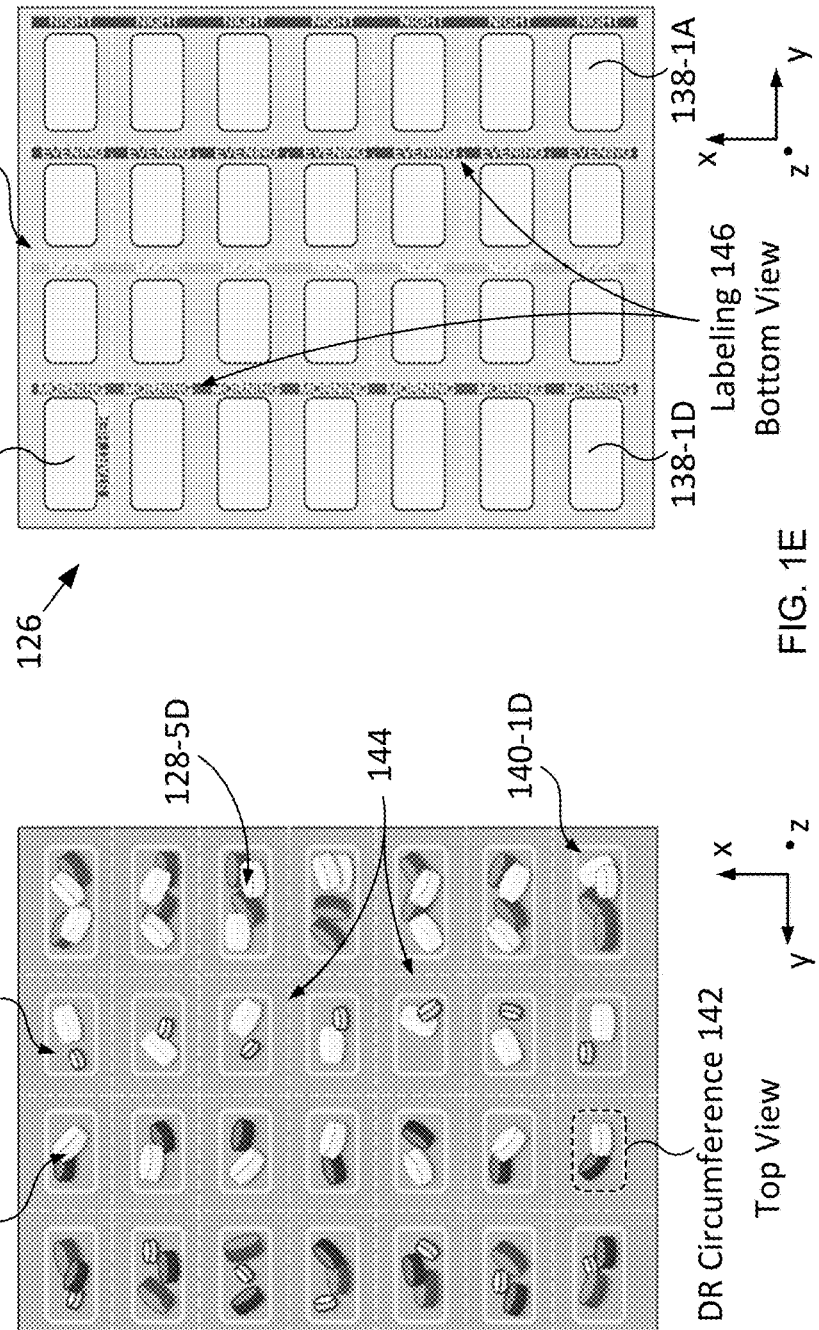

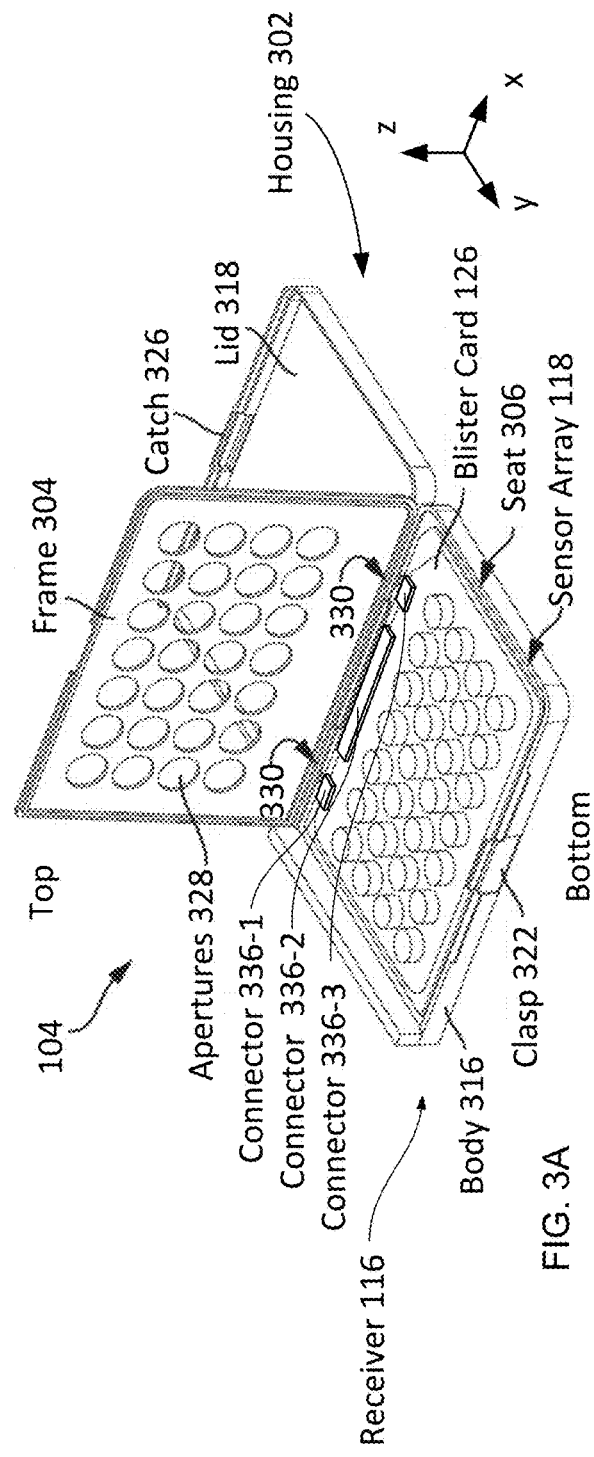
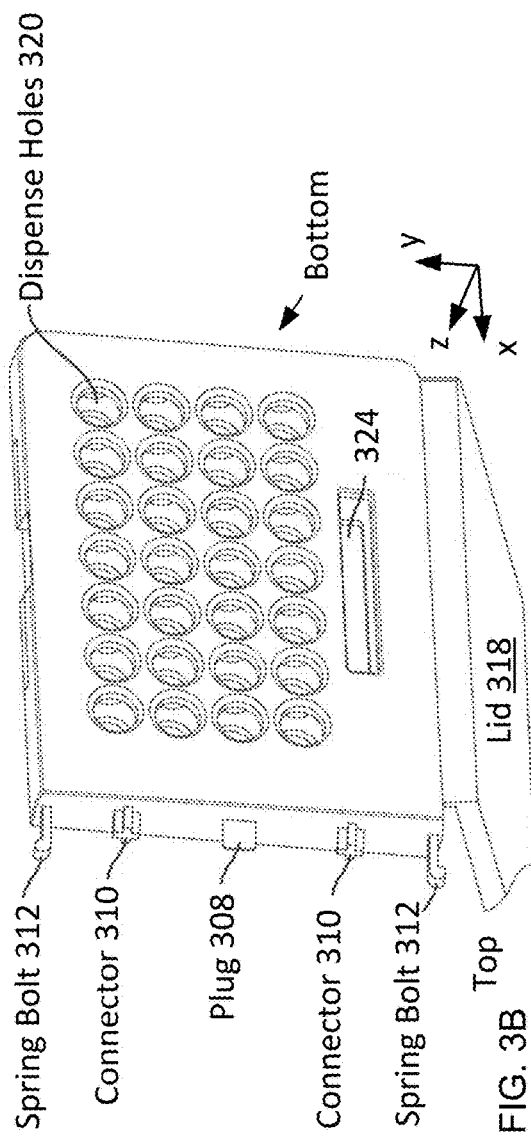
FIG. 3A
FIG. 3B

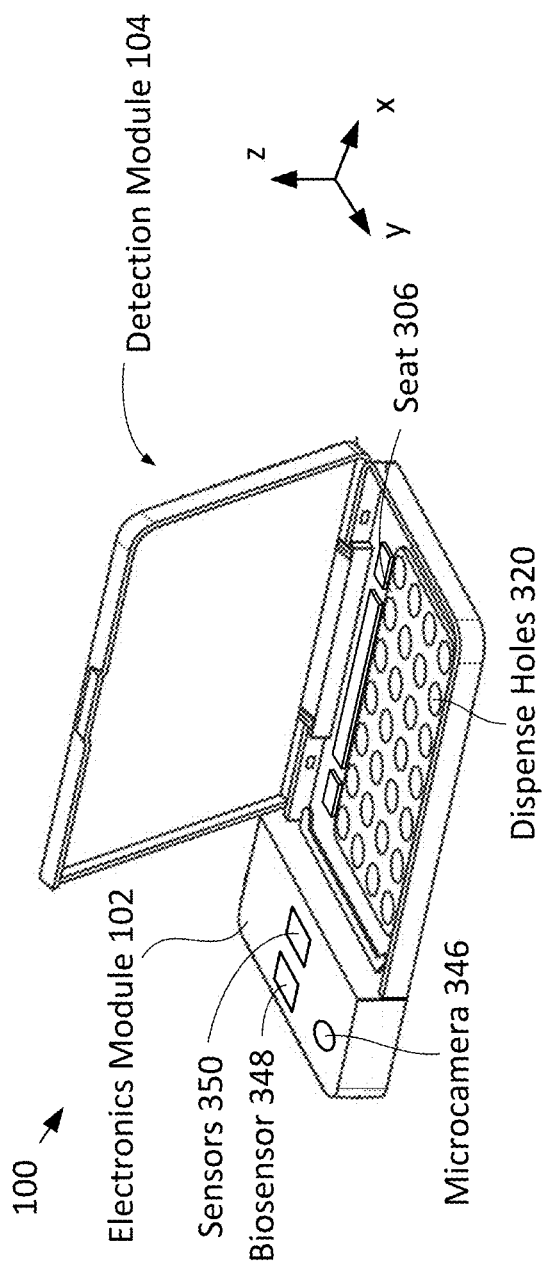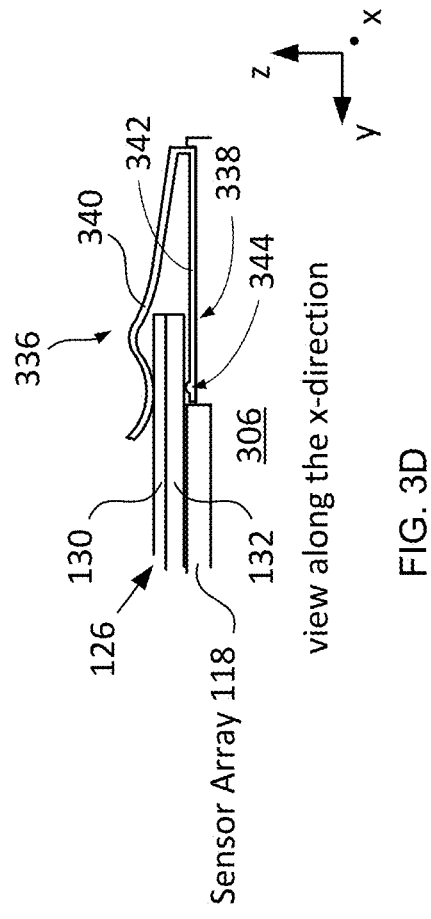

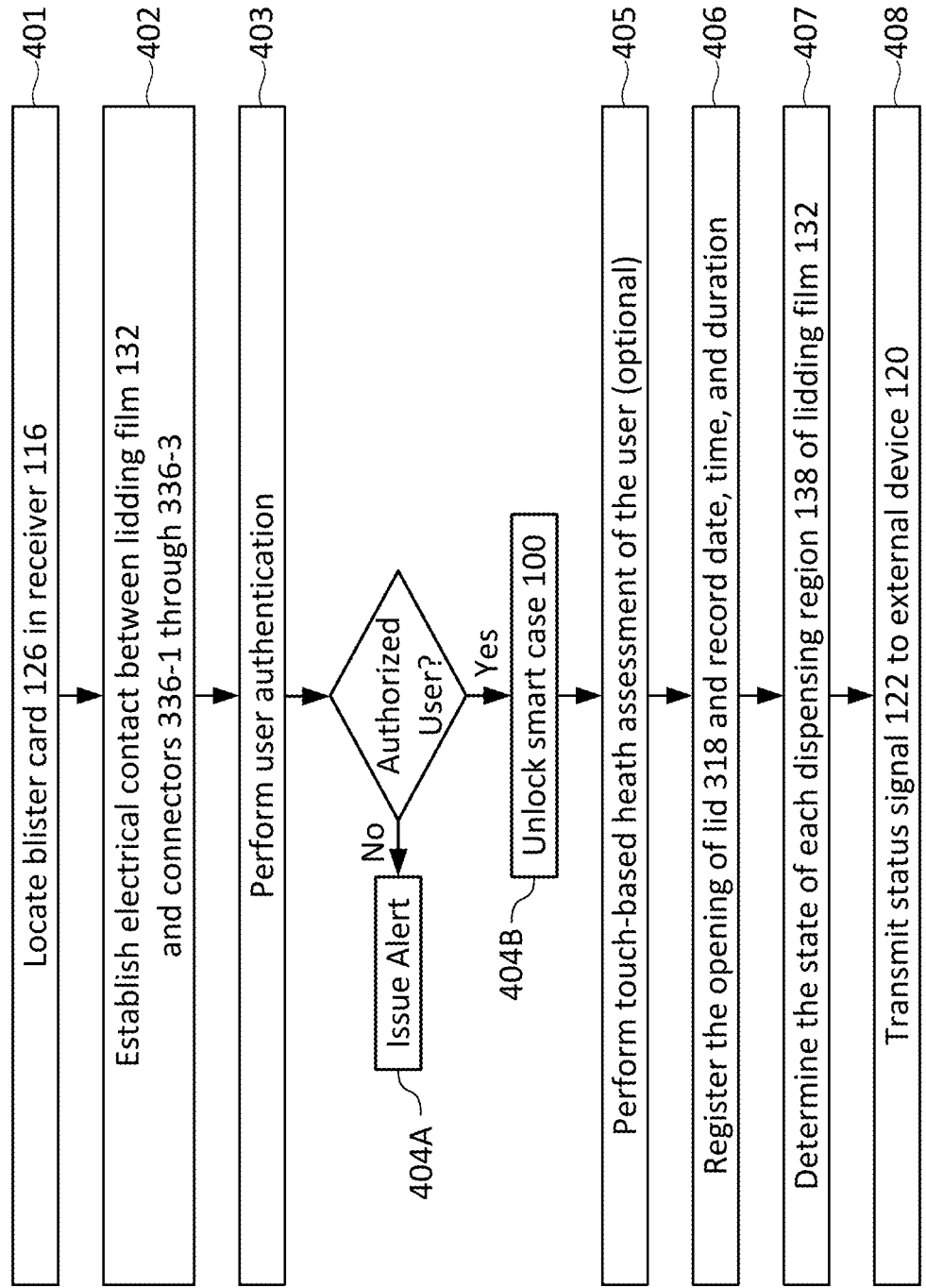

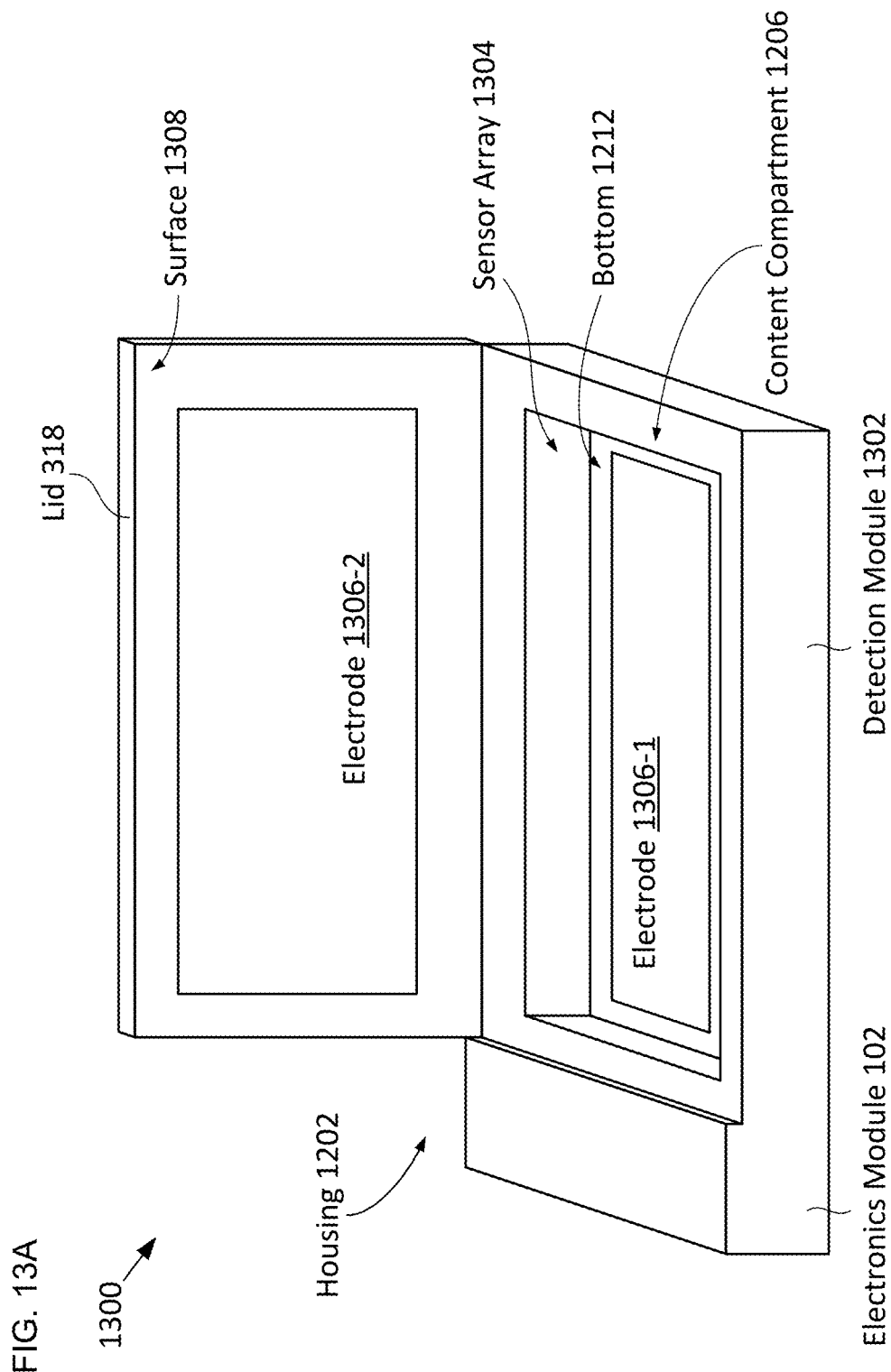

SMART PACKAGING FOR IMPROVED MEDICATION REGIMEN COMPLIANCE

CROSS REFERENCE TO RELATED APPLICATIONS

This application is a continuation of co-pending U.S. patent application Ser. No. 17/468,217, filed Sep. 7, 2021, entitled "Smart Packaging for Improved Medication Regimen Compliance," which is a continuation of U.S. patent application Ser. No. 16/825,981 (now U.S. Pat. No. 11,193,903), filed Mar. 20, 2020, entitled "Smart Packaging for Improved Medication Regimen Compliance," which is a continuation of U.S. patent application Ser. No. 16/156,603 (now U.S. Pat. No. 10,634,633), filed Oct. 10, 2018, entitled "Smart Packaging for Improved Medication Regimen Compliance," which claims the benefit of U.S. Provisional Patent Application Ser. No. 62/570,328, filed Oct. 10, 2017, entitled "Smart Packaging for Improved Medication Regimen Compliance," each of which is incorporated herein by reference.

If there are any contradictions or inconsistencies in language between this application and the case that has been incorporated by reference that might affect the interpretation of the claims in this case, the claims in this case should be interpreted to be consistent with the language in this case.

TECHNICAL FIELD

The present disclosure relates to packaging in general, and, more particularly, to smart packaging.

BACKGROUND

Adherence to prescribed medication regimen is central to achieving intended health outcome. However, it is well known in the industry that adherence is generally poor across various medications. As a result, intended health outcomes are compromised, placing cost on the healthcare system for remedial care. By way of example:
  The total direct cost of unintended pregnancy in 2010 is $11B. A publicly funded birth in 2010 cost ~$12,770.
  51% of all U.S. births in 2010 were paid for by public insurance. Public insurance paid for 68% of the 1.5 million unplanned births in 2010, compared with 38% of planned birth.
  These numbers would be as if the U.S. federal and state governments spent ~$336 on unintended pregnancies for every woman aged 15-44.
  Women of childbearing age use various forms of birth control, of which the oral contraceptive pill (OCP) is a common choice. Poor adherence to OCP regimens is the main cause of unintended pregnancy for women using OCP.

A common approach to improving medication adherence has been "reminders". Reminder notifications are typically automated and delivered in the form of alarms, text message, calls and/or e-mails. A mobile device—usually a smart phone or tablet—running mobile application software is often the user interface for receiving such notifications. Alternatively, medication may be placed in a case/vessel/package that incorporates electronic provisions for tracking adherence and issuing audio/visual notifications. In some cases, the case/vessel/package may be wirelessly linked to a mobile device to notify the user on the mobile device and on the vessel/package both. Approaches such as the above are commonly referred to as "smart packaging".

SUMMARY

The present disclosure teaches systems and methods that facilitate tracking of adherence to medicine regimens, such as medicine prescription regimens, through connected, smart packaging. Embodiments in accordance with the present disclosure are particularly well suited for use with blister cards having a forming film in which a plurality of blisters is formed and an electrically conductive lidding film, where the blisters and lidding film collectively define a plurality of reservoirs for holding one or more tablets. Each reservoir is defined by a blister formed in the forming film and a dispensing region that includes a portion of the lidding film.

An illustrative embodiment is a modular smart case that includes an electronics module and a detection module. The detection module comprises a housing having a receiver for removably locating a blister card in a first position in which its lidding film is held against (i) a sensor array that includes a substrate having a platen and an array of through-holes and (ii) a seat that includes a plurality of dispense holes. The tablets of the blister card, the sensors and through-holes of the sensor array, and the dispense holes are all arranged in the same arrangement. The receiver locates the blister card such that each reservoir of the blister card is aligned with a different sensor and dispense hole. The receiver includes a plurality of electrical connectors that electrically couple, resistively or capacitively, with the lidding film of the blister card to electrically ground the lidding film and confirm that it is located in the receiver.

Each sensor of the sensor array includes a pair of electrical contacts that are located on either side of its respective through-hole and configured to electrically couple with the lidding film. The electrical contact are configured to measure the impedance across the dispensing region of its respective reservoir. When the tablet is dispensed from the reservoir, the dispensing region is ruptured, thereby changing the impedance measured by the contacts of the sensor with which it is operatively coupled.

The through-hole of each sensor includes a serration that is configured to facilitate the breakage of the lidding film near it when force is applied to its respective tablet from the blister side. In some embodiments, the serration is a continuous "blade" that surrounds the periphery of the dispense hole. In some embodiments, the serration includes one or more substantially discrete tips that are dimensioned and arranged to concentrate the applied force within a smaller area of the lidding film to initiate its puncture. Preferably, a serration in accordance with the present disclosure has a low profile to mitigate the risk of injury to a user during a dispensing operation.

In some embodiments, a plurality of connectors is distributed around the perimeter of a region of the blister card such that, when the blister card is in the first position, the state of the region is determined using electrical impedance tomography.

In some embodiments, the plurality of connectors are configured as electrodes used to electrically couple with the lidding film is located on the platen. In some embodiments, the plurality of electrodes is distributed between the receiver and the seat.

An embodiment of the present invention is a smart case (100) for monitoring the state of a blister card (126) that includes a forming film (130), a lidding film (132) that includes a first region (142) that is electrically conductive and unpatterned and includes a plurality of dispensing regions (138) within the first region, and a plurality of tablets (128) contained in a plurality of reservoirs (136) that is arranged in a first arrangement, each reservoir being defined by the forming film and a different dispensing region of the plurality thereof, wherein the case comprises: (1) an electronics module (102); and (2) a detection module (104) that includes: (i) a housing (302) having a lid (318) and a body (316), wherein the lid is movable relative to the body; and (ii) a receiver (116) that includes a frame (304), a seat (306), and a plurality of connectors (336) that are electrically connected with the electronics module when the electronics module and detection module are operatively coupled, the receiver being configured to removably locate the blister card such that the lidding film and connectors are electrically coupled; wherein the electronics module includes electronic circuitry (112) that is configured to measure a first impedance across at least a portion of the first region when the blister card is located in the receiver.

Another embodiment of the present invention is a method for monitoring the state of a blister card (126) that includes a forming film (130), a lidding film (132) that includes a first region (142) that is electrically conductive and unpatterned and includes a plurality of dispensing regions (138) within the first region, and a plurality of tablets (128) contained in a plurality of reservoirs (136) that is arranged in a first arrangement, each reservoir being defined by the forming film and a different dispensing region of the plurality thereof, wherein the method comprises: (1) locating a blister card in a receiver (116) that includes a frame (304), a body (316), and a plurality of connectors (336), wherein the blister card is located in the receiver such that each connector of the plurality thereof is electrically coupled with the lidding film; (2) measuring a first impedance across at least a portion of the first region; and (3) transmitting a status signal (122) that is based on the measured first impedance.

BRIEF DESCRIPTION OF THE DRAWINGS

FIG. 1A depicts a functional block diagram of a modular medicine case in accordance with an illustrative embodiment in accordance with the present disclosure.

FIG. 1B depicts a schematic drawing of a perspective view of a blister card in accordance with the illustrative embodiment.

FIG. 1C depicts a schematic drawing of a cross-sectional view of one tablet region of blister card 126.

FIGS. 1D-E depict plan view schematic drawings of the front (forming-film side) and back (lidding-film side) of blister card 126.

FIGS. 3A-B depict schematic drawings of perspective views from the top and bottom sides of a detection module in accordance with the illustrative embodiment.

FIG. 3C depicts a schematic drawing of a perspective view of smart case 100.

FIG. 3D depicts a side view of a representative connector 336 engaged with blister card 126.

FIG. 4 depicts operations of a method suitable for monitoring the state of a blister card in accordance with the illustrative embodiment.

FIG. 13A depicts a schematic drawing of a perspective view of another alternative smart case that is configured for monitoring the contents of a single, large-area reservoir content compartment in accordance with the present disclosure.

DETAILED DESCRIPTION

Figure 2:
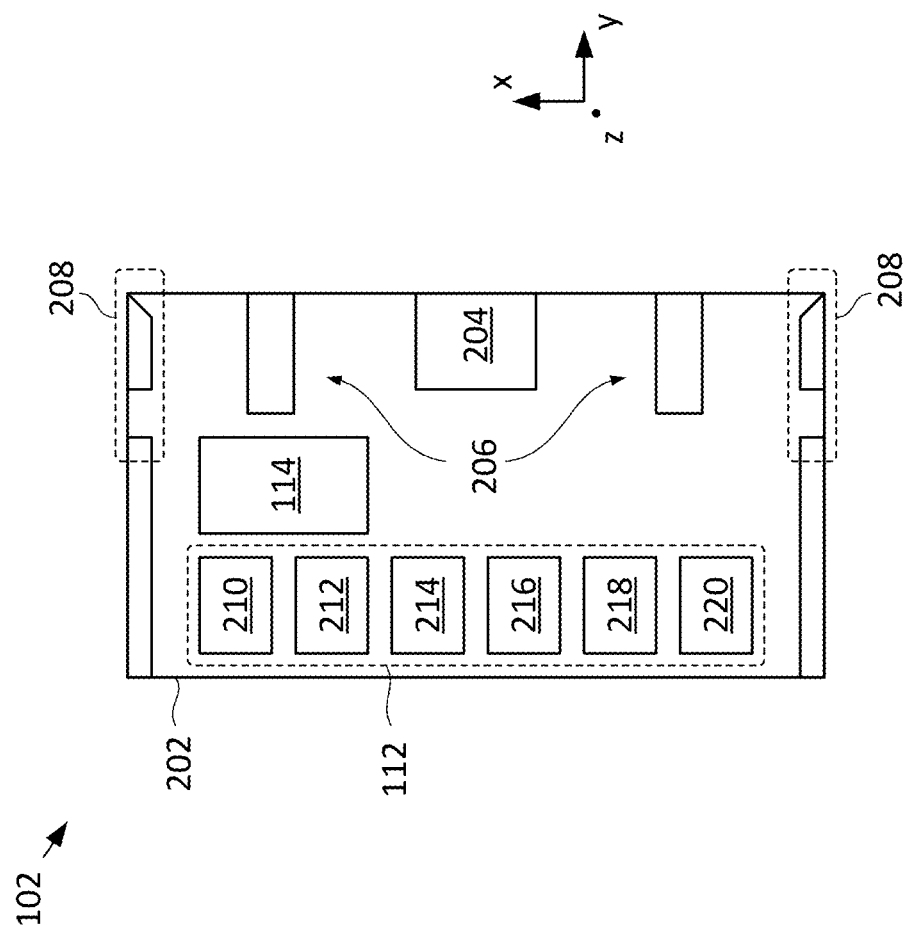
FIG. 2 depicts a schematic drawing of an electronics module in accordance with the illustrative embodiment.

It should be noted that, although embodiments in accordance with the present disclosure are described herein with respect to OCP as an exemplary application, concepts of the present disclosure are applicable to a wide range of other applications; therefore, the use of OCP should not be viewed as limiting the scope of the utility of the concepts described herein. Other examples of applications in which the smart packaging concepts of the present disclosure can be used include, without limitation, other forms of medication, non-medication products (e.g., vitamins, supplements, etc.), foodstuff, gum, beverages, toiletry and beauty care products, razor blades, consumer electronics, toner cartridges, toys, tools, etc. In other words, the teachings of the present disclosure are applicable to myriad product-tracking applications. In this Specification, "tablet" and "pill" are used interchangeably and are intended to include various form factors, sizes and compositions.

FIG. 1A depicts a functional block diagram of a modular medicine case in accordance with an illustrative embodiment in accordance with the present disclosure. Case 100 includes electronics module 102, detection module 104, and universal interface 134. for joining the electronics and detection modules. Universal interface 132 includes electrical interface 106, mechanical interface 108, and latch 110. Case 100 is a modular smart case for tracking the state of blister card 126, which in the depicted example, is a 4×7 format OCP blister card. Although case 100 is a modular case that includes separable electronics and detection modules, the teachings of the present disclosure are applicable to smart cases having electronics and detection modules that are not separable and the description of a modular case should not be considered limiting to the scope of the appended claims.

FIG. 1B depicts a schematic drawing of a perspective view of a blister card in accordance with the illustrative embodiment.

FIG. 1C depicts a schematic drawing of a cross-sectional view of one tablet region of the blister card shown in FIG. 1B. The cross-sectional view shown in FIG. 1C is through line a-a of FIG. 1B.

FIGS. 1D-E depict plan view schematic drawings of the front (forming-film side) and back (lidding-film side) of blister card 126.

Blister card 126 includes a plurality of tablets 128, each of which is contained within reservoir 136. Reservoir 136 is formed by blister 140 of forming film 130 and dispensing region 138. Dispensing region 138 is the region of lidding film 132 that forms the bottom of reservoir 136 and is the lidding-film portion through which tablet 128 is pushed when it is dispensed. Each dispensing region 138 is characterized by DR circumference 142, which is defined by the annulus at which its respective blister 140 is joined with lidding film 132. In some embodiments, case 100 is configured to operate with a blister card in which at least one reservoir 136 includes a plurality of tablets 128.

Forming film 130 is a layer of thermoformed plastic in which cavities for holding tablets 128 are formed.

Lidding film 132 is a thin sheet of aluminum foil. In some embodiments, lidding film 132 is a sheet of another electrically conductive material. In some embodiments, lidding film 132 includes a sheet of conductive material and a sheet of electrically insulating material, such as a paper sheet (with a printed calendar or instructions), polymer, etc. on the bottom side of the lidding film and/or sandwiched between the lidding and forming films. After tablets 128 are dispensed into the cavities of forming film 130, lidding film 132 is joined with the forming film 130 to seal the cavities, thereby forming reservoirs 136, which enclose tablets 128. Typically, a calendar that describes the drug regimen is printed on the card and/or otherwise provided as part of the blister card.

Blister card 126 includes optional perforation lines 144, which are incorporated to facilitate tearing off a segment of the card corresponding to a dose. As a result, each time a dose is dispensed, the user can discard the corresponding segment of the blister card.

Blister card 126 also includes optional labeling 146 for providing dosing regimen information directly on the back of the blister card. In some cases, labeling 146 includes other information, such as a calendar that denotes the drug regimen, manufacturing information (date, lot number, etc.), and the like.

It is an aspect of the present disclosure that the teachings herein are suitable for use with any blister card whose lidding film 132 is unpatterned (i.e., has not been patterned to define electrically conductive traces). In other words, before any of tablets 128 have been dispensed, the electrically conductive material of lidding film 132 of blister card 126 exists everywhere within two-dimensional region 142.

The portion of lidding film 132 that seals each cavity to form a reservoir defines dispensing region 138, through which its respective tablet 128 is dispensed by pushing the tablet through the lidding foil.

One skilled in the art will recognize that many types of medication and non-medication (e.g., vitamins, supplements, etc.) are offered in a form suitable for packaging in a blister card, such as tablets, capsules, lozenges, etc. For the purposes of this Specification, including the appended claims, the term "tablet" is used as a general term that encompasses all such medicinal and non-medicinal forms.

FIG. 2 depicts a schematic drawing of an electronics module in accordance with the illustrative embodiment. Electronics module 102 includes housing 202, electronic circuitry 112, communications circuitry 114, socket 204, ports 206, and catches 208.

Housing 202 is a conventional molded plastic housing configured to enclose electronics circuitry 112 and communications circuitry 114 in a substantially environmentally sealed environment.

Electronic circuitry 112 includes controller 210, memory 212, sensor circuit 214, power circuit 216, display circuit 218, and sleep-mode circuitry 220. The circuitry included in electronics circuitry 112 enable it to interface with the sensor array included in detection module 104, as well as receive and condition the output signals of each sensor (e.g., provide pre-amplification, digitization, etc.), provide power conditioning and management, display information to the user, etc.

Controller 210 is a conventional processor having signal processing and computation capabilities.

Memory 212 is a conventional memory module for storing information and data.

Sensor circuit 214 is configured to receive sensor signals from the sensor array of detection module 104 via electrical interface 106, measure the sensor signals to detect changes in the state of a blister card held in the detection module, and the like.

Power circuit 216 includes an energy-storage unit and power management circuitry. In the depicted example, the energy-storage unit is a rechargeable battery; however, a different energy-storage unit can be used in power circuit 216 without departing from the scope of the present disclosure. Energy-storage units suitable for use in embodiments in accordance with the present disclosure include, without limitation, non-rechargeable batteries, super capacitors, and the like. In some embodiments, power circuit 216 includes one or more energy-scavenging devices (e.g., solar cells, vibration harvesters, etc.) for passively recharging the energy-storage unit.

Display circuit 218 includes a status indicator and drive circuitry for the status indicator. In the depicted example, the status indicators are light-emitting diodes (LED); however, other status indicators, such as liquid-crystal displays, LED-based displays, speakers, buzzers, and the like, can be used in display circuit 218 without departing from the scope of the present disclosure.

Display circuit 218 includes an LED for each row and column of pills to signal their respective row and column, where the LEDs illuminate (or blink) to indicate the respective row and column from which the pill should be dispensed. In some embodiments, each row and column have a pair of LEDs of different colors that guide the user to the correct tablet by turning on (or blinking) the respective LED of a first color, while cautioning the user against the other tablets by turning on (or blinking) the LEDs of the other color. In some embodiments, row/column addressing LEDs are located at the periphery of the blister card within detection module 104. In some embodiments, each tablet site is provided its own dedicated LED or LED pair.

In some embodiments, display circuit 218 includes provisions for user feedback to, for example, correlate a patient's health status and the need for the medication in the content compartment of smart case 100. In some embodiments, a status indicator is binary (e.g., good or bad). In some embodiments, a status indicator is more nuanced (e.g., good, fair, poor or bad). Typically, status feedback is generated via user-actuated buttons located on the case. In some embodiments, a touch screen display is incorporated in smart case 100 to enable communication of information to the user.

Sleep-mode circuitry 220 includes low-power dissipation circuitry, a wake-up circuit, and a low-power-dissipation accelerometer. Sleep-mode circuitry 220 facilitates long battery life between charges by enabling an extremely low-power dissipation mode during periods of case inactivity. Other types of sensors (e.g., touch, plunger switch under the lid of the case, finger print, radio frequency, etc.) can also be used in realizing a wake-up circuit. In some cases, a combination of sensors are used for implementing a wake-up circuit. In response to an environmental stimulus, such as detection of activity in the case of the accelerometer (e.g., shock and/or vibration associated with shaking the case, etc.), a wake-up signal received from external device 120, and the like, the wake-up circuit activates electronics circuitry 112 such that it operates in a conventional power-dissipation mode in which it can determine the state of the blister card located in detection module 104 and output its status to the user.

Communications circuitry 114 includes a wireless Bluetooth Low-Energy (BLE) transceiver for sending status signal 122 to external device 120 and receiving operational communications 124 from external device 120. In some embodiments, communications circuitry includes a different wired and/or wireless communications electronics, such as FireWire, USB, lightning connector, a dock connector, cellular, WiFi, near-field-communications (NFC) radio, optical links, etc.

In the depicted example, external device 120 is a smart phone that runs a software application (i.e., a mobile app) that provides assistance to the patient and/or caregiver to achieve and maintain good adherence to the prescribed drug regimen. In some embodiments, external device 120 is a different device, such as a different mobile device (e.g., smart watch, computer tablet, etc.), a computer, a gateway and/or a base station.

The smart case and smartphone app determine the state of the blister card and provide a visual and/or audible indication of adherence. If failure to follow the regimen is detected, the smartphone contacts one or more people in the user's defined support group (e.g., a caregiver, spouse, child, doctor, etc.) to alert them that the user might require assistance.

Socket 204 is a conventional electrical socket that is a first portion of electrical interface 106. Socket 204 is configured to receive a plug disposed on detection module 104. Once the socket and plug are engaged, electrical communication between electronics circuitry 112 and sensor array 118 on the detection module is enabled.

Ports 206 are a pair of conventional female mechanical connectors that collectively define a first portion of mechanical interface 108. Ports 206 are configured to engage a pair of conventional male mechanical connectors included in detection module 104. In the depicted example, the ports and male mechanical connectors are configured to enable only one orientation between the electronics and detection modules (i.e., they are "keyed") to ensure that the modules engage properly.

Catches 208 are mechanical structures that define a first portion of latch 110. Each of catches 208 is configured to engage a mating spring bolt that extend from the mating surface of detection module 104. Catches 208 reversibly lock the two modules together to form a fully assembled smart medicine case.

It should be noted that the configuration and capabilities of electronics module 102 described above is merely exemplary and that myriad alternative configurations having more or less electronics functionality can be used for the electronics module without departing from the scope of the present disclosure. For example, in some embodiments, electronics module 102 includes, without limitation:

i. additional processing capability; or
    ii. onboard clock circuitry; or
    iii. energy scavenging systems, or
    iv. alternative or additional sensor interface circuitry; or
    v. alternative or additional on-case alerts (e.g., LCD displays, speakers, buzzers, etc.); or
    vi. environmental (e.g., touch, temperature, acceleration, humidity, shock, geolocation, etc.) sensors; or
    vii. any combination of i, ii, iii, iv, v, and vi.

In some embodiments, smart case 100 includes a microphone and/or speakers, as well as artificial intelligence and machine learning software, such that the smart case is substantially functional as a virtual assistant. In some embodiments, smart case 100 is provisioned to connect and work with smart speakers to provide virtual assistant functionality.

One skilled in the art will recognize, after reading this Specification, that the design features of smart case 100 are based on the particular arrangement of blister card 126, as well as the sensing technology used to monitor its state and, as provided herein, are merely exemplary. Myriad alternative design features are possible without departing from the scope of the present disclosure.

FIGS. 3A-B depict schematic drawings of perspective views from the top and bottom sides of a detection module in accordance with the illustrative embodiment. Detection module 104 includes housing 302, receiver 116, sensor array 118, plug 308, connectors 310, and spring bolts 312.

Housing 302 is a conventional molded plastic housing comprising body 316 and lid 318, which is typically connected to body 316 via a flexible hinge portion.

Body 316 comprises seat 306, dispense holes 320, clasp 322, and optional view port 324.

FIG. 3C depicts a schematic drawing of a perspective view of smart case 100. Each dispense hole 320 is aligned with a different sensor of sensor array 118. FIG. 3C depicts smart case 100 in its assembled state (i.e., wherein electronics module 102 and detection module 104 are mechanically and electrically engaged). It should be noted that, for clarity, neither sensor array 118 nor frame 304 is shown in FIG. 3C.

The arrangement of dispense holes 320 matches that of the arrangement of tablets in blister card 126, thereby enabling each dispense hole to pass a different tablet 128 through body 316 when that tablet is dispensed.

View port 324 is an opening formed in body 316 to expose a portion of blister card 126 for viewing. View port 324 is optionally included to enable information printed on a blister card (such as a bar code, etc.) to be read through housing 302.

Lid 318 is a substantially rigid "clam shell" structure that includes catch 326, which engages clasp 322 when lid 318 is closed to hold the body and lid together.

FIG. 4 depicts operations of a method suitable for monitoring the state of a blister card in accordance with the illustrative embodiment. Method 400 is described herein with continuing reference to FIGS. 3A-C, as well as reference to FIGS. 3D, 4, 5, and 6A-B. Method 400 begins with operation 401, wherein blister card 126 is loaded into receiver 116.

Receiver 116 includes frame 304, seat 306, sensor array 118, and connectors 336-1 through 336-3.

Frame 304 and seat 306 are collectively configured to locate sensor array 118 and hold blister card 126 such that each tablet location of the blister card is operatively coupled with a different sensor of the sensor array and a different hole of dispense holes 320.

Frame 304 is a substantially rigid plate comprising apertures 328, each of which exposes a different tablet of the blister card when the frame is locked in place. Frame 304 is connected to body 316 via conventional hinges 330, which allow the frame to rotate out of the way to enable installation of a blister card in the detection module and rotate back over the blister card to engage with a catch (not shown) that secures the frame and blister card to body 316. In some embodiments, frame 304 includes ribs between the rows and or columns of apertures to enhance the rigidity of the frame. In some of these embodiments, the ribs project downward toward sensor array 118, which resides on seat 306 such that they help force blister card 126 against the sensor array when the frame is engaged with its corresponding catch. It should be noted that lid 318 and hinges 330 are configured to avoid mechanical interference between them.

Seat 306 is a recessed region of body 316 that is configured to accept sensor array 118 and blister card 126 and laterally position the blister card to align its tablets with the sensors and through-holes of sensor array 118, as well as dispense holes 320. In some embodiments, seat 306 is not included. In some embodiments, seat 306 is formed as part of frame 304. In some embodiments, the alignment functionality of seat 306 is realized via raised features placed at the perimeter of the blister card, rather than a full perimeter frame. In some embodiments, sensor array 118 includes raised features for laterally positioning a blister card.

In order to ensure good electrical coupling/contact between lidding film 132 and sensor array 118, a good mechanical contact between the blister card and the surface on which it rests is needed. In some embodiments, the inside surface of the lid of the case incorporates a compressible liner that exerts downward pressure on the blister card when the case is closed to accomplish a good mechanical contact. An added benefit of such a liner is that the card is immobilized in place when the lid is closed. Such a compressible liner can comprise any of a variety of materials, such as foam, sponge, bubble wrap, spring-load plates, and the like. Preferably, the liner is attached to the inside surface of the lid, but can also be used without such attachment—like a cushion or a packing.

At operation 402, electrical contact is established between lidding film 132 and each of connectors 336-1 through 336-3.

FIG. 3D depicts a side view of a representative connector 336 engaged with blister card 126. Each of connectors 336-1 through 336-3 (referred to, collectively, as connectors 336) is a conventional "leaf-spring" wiper contact that includes spring portion 340, base portion 342, and optional projection 344.

Connectors 336 are configured to enable insertion of an edge of blister card 126 between spring portion 340 and base portion 342. Each of the connectors 336-1 through 336-3 is configured such that spring portion 340 exerts a downward force on the blister card that helps keep the blister card in place and also facilitates good electrical contact between the connector and lidding film 132. In the depicted example, connectors 336 include optional projection 344, which concentrates the force applied by spring portion 340 between projection 344 and the lidding film.

In the depicted example, seat 306 includes optional recess 338, which is configured to mount connectors 336-1 through 336-3 such that the top of the base portion of each connector—housed in recess 338—is substantially flush with the top surface of seat 306.

Although in the illustrative embodiment connectors 336 are leaf-spring connectors, it should be noted that myriad alternative connectors can be used to provide good mechanical and electrical coupling/contact with lidding film 132 without departing from the scope of the present disclosure. For example, in some embodiments, at least one of connectors 336 is a clamp-like connector. Furthermore, in some embodiments, at least some of the functionality of connectors 336-1 through 336-3 is realized via contacts disposed on the surface on which the lidding film rests.

In the depicted example, connectors 336 are electrically connected to electronic circuitry 112 such that connector 336-2 is electrically connected to ground. As a result, when blister card 126 is inserted into detection module 104, lidding film 132 is electrically grounded. In addition, electronic circuitry 112 measures the resistance between connectors 336-1 and 336-3. Detection of a non-infinite resistance between connectors 336-1 and 336-3 confirms that blister card 126 is inserted into the detection module.

As discussed below, in some embodiments, connectors 336 are not in direct physical contact with lidding film 132 due to an intervening insulating layer. In such cases, connectors 336 are capacitively coupled with the lidding film and the electrical impedance is measured between connectors 336-1 and 336-3 to establish whether blister card 126 is inserted into the detection module. For the purposes of this Specification, including the appended claims, the terms "impedance" and "resistance" are used interchangeably.

In some embodiments, connectors 336-1 and 336-3 are locally connected to electronic circuitry located within detector module 104 itself.

In addition, in some embodiments, connectors 336 also guide the placement of blister card 126 in case 100, where the blister card is inserted into the clips by sliding it under the clips.

Exemplary smart case 100 also includes optional microcamera 346 and biosensor 348.

At operation 403, user authentication is performed by taking an image of the user via microcamera 346 and comparing the acquired image with one or more authorized-user images stored in memory 212. In some embodiments, user authentication is performed via a finger-print sensor instead of, or in addition to, microcamera 346.

If user authentication fails, method 400 proceeds with operation 404A, wherein an alert is generated. In the depicted example, the alert is generated as an audible alarm emitted by a speaker located on the case (not shown). In some embodiments, the alert includes a message sent to a corresponding app on the user's phone, and/or through an e-mail to the user, or someone designated by the user, and the like. Typically, such a message includes the time and/or case location when the lid was opened, what tablet was dispensed, etc., which is also stored in memory 212 for future synching with the phone/network if (wireless) connection is not available at the time.

If user authentication succeeds, at least one of catch 326 and clasp 322 is electrically actuated to release lid 318 from body 316 thereby enabling smart case 100 to be opened. It should be noted that the use of electrically actuated catches and/or clasps are optional; however, preventing smart case 100 from being opened without proper authentication provides real-time safeguards against unauthorized access to the content compartment.

At optional operation 405, a health assessment of the user is performed. Such an assessment is performed via biosensor 348 and/or sensors 350.

Biosensors 348 are conventional multi-electrode touch sensors suitable for measuring a user parameter, such as bio-impedance and/or bio-potential measurements. For example, the user may touch (e.g., with his/her index fingers) two electrodes for a one-lead electrocardiogram (ECG) measurement. In some embodiments, three or more electrodes are disposed on electronics module 102 to enable a more comprehensive ECG measurement, for example: monitor outcome along with adherence for heart disease patients using a smart pill case for heart disease medication; monitor side effects and/or interactions of OCP or other medications the user is taking in addition to the prescribed medication, and the like.

Sensors 350 include environmental sensors, such as gas sensors, which enable, among other things: to monitor environmental constituents and correlate them to the health and wellness conditions of the user; breath analysis (alone or in combination with humidity and temperature sensors) to monitor bad, cigarette and alcohol constituents, disease states, etc. Sensor data can be used to, for example: to alert the user to dispense a breath mint or piece of gum from the content compartment if halitosis is detected; warn the user to delay taking medication when an improper alcohol content of the breath is detected; warn the user that environmental factors (e.g., temperature, humidity, air quality, etc.) are potentially dangerous for patients with respiratory sensitivities and diseases and alert the user to take his/her corresponding medication in the content compartment and correlate the corresponding environmental factors that trigger the need for a dose, and the like.

It should be noted that touch- and gas-sensor data can be used in association with medicinal or non-medicinal use of smart case 100. For example, a smart case used to hold blister-packaged gum can be configured to alert the user when sensor data indicates a condition, such as bad breath (e.g., due to food consumption, cigarette use, alcohol consumption, etc.), that can be mitigated by taking a piece of gum from the smart case. Furthermore, tracking the sensor data and actions can help a user better address related concerns.

In some embodiments, one or more gas sensors are incorporated within one or both of electronics module 102 and detection module 104 such that the user uses the sensors by blowing onto a port that is fluidically coupled with the sensors. An ultraviolet radiation sensor on a case placed next to a user can for example be used to alert the user to apply sunblock from the content compartment of the case. It should be noted that health assessment of a user, as described above, is applicable for use with other containers, such as pill bottles, multi-tablet blister cards, and the like.

Examples of containers for which user health assessment is particularly well suited are described in such as those described in U.S. patent application Ser. No. 14/879,874, filed Oct. 9, 2015, Ser. No. 15/170,121, filed Jun. 1, 2016, Ser. No. 15/223,779, filed Jul. 29, 2016, and U.S. Provisional Patent Applications Ser. No. 62/062,291 filed on Oct. 10, 2014, 62/320,234 filed on Mar. 25, 2016, each of which is incorporated herein by reference.

At operation 406, the opening of lid 318 is registered and stored in memory 212. The opening of lid 318 is sensed by an electrical plunger switch (not shown), which is mechanically coupled with the lid. Triggering of the switch typically initiates several actions, such as recording date, time and duration. In some embodiments, the opening of lid 318 initiates a wakeup circuit is included to reduce power consumption when the case is not in use. Wakeup circuits in accordance with the present disclosure can include, without limitation, accelerometers, touch circuits, etc.

At operation 407, sensor array 118 determines the state of each dispensing region 138 of lidding film 132.

Figure 5:
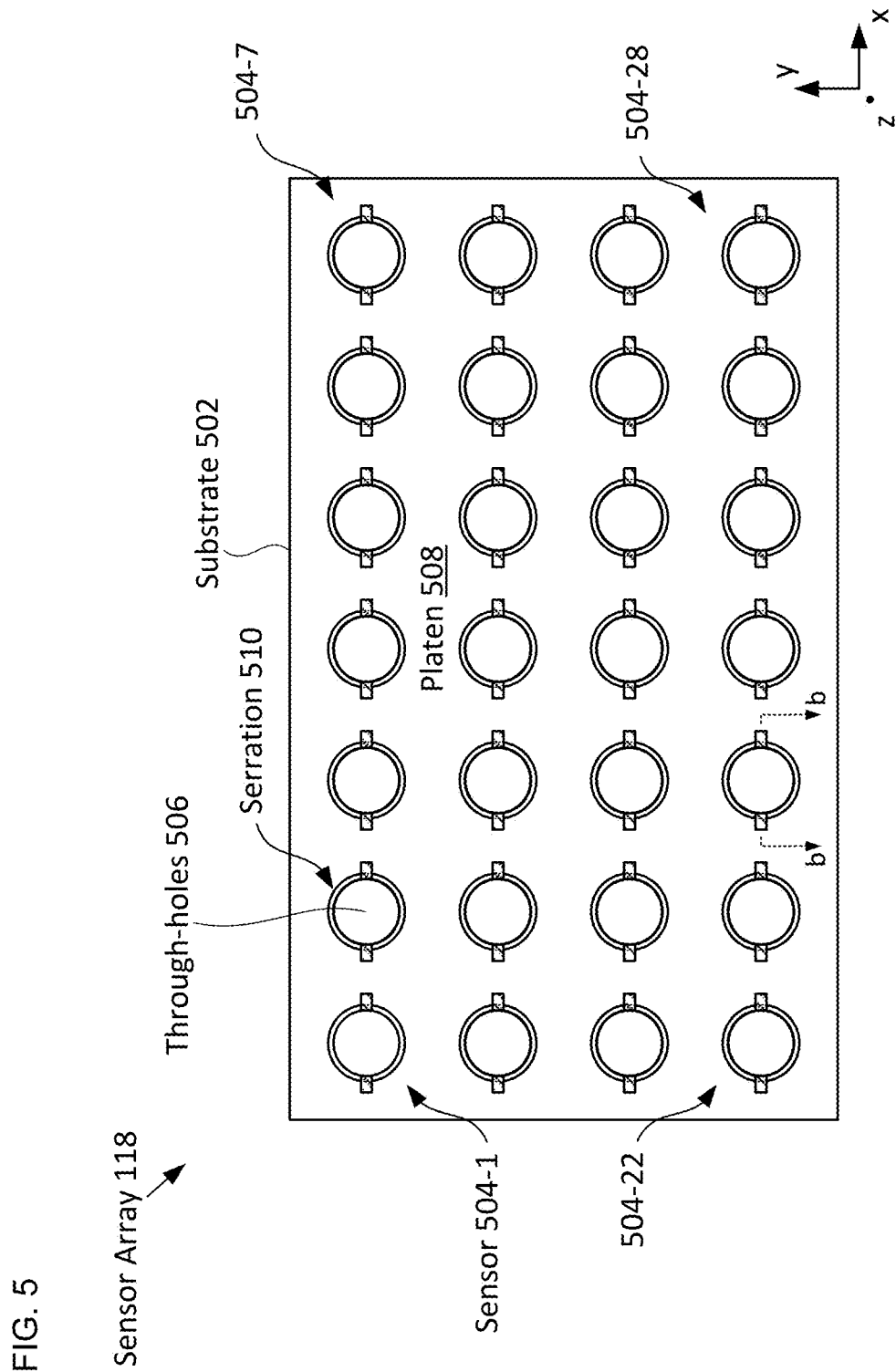
FIG. 5 depicts a schematic drawing of a top view of a sensor array in accordance with the illustrative embodiment.

FIG. 5 depicts a schematic drawing of a top view of a sensor array in accordance with the illustrative embodiment. Sensor array 118 (not shown in FIGS. 3A-C) comprises substrate 502, sensors 504-1 through 504-28, and throughholes 506. Each of the pluralities of sensors and throughholes is arranged in the same arrangement as tablets 128 and dispense holes 320.

Figure 6A:
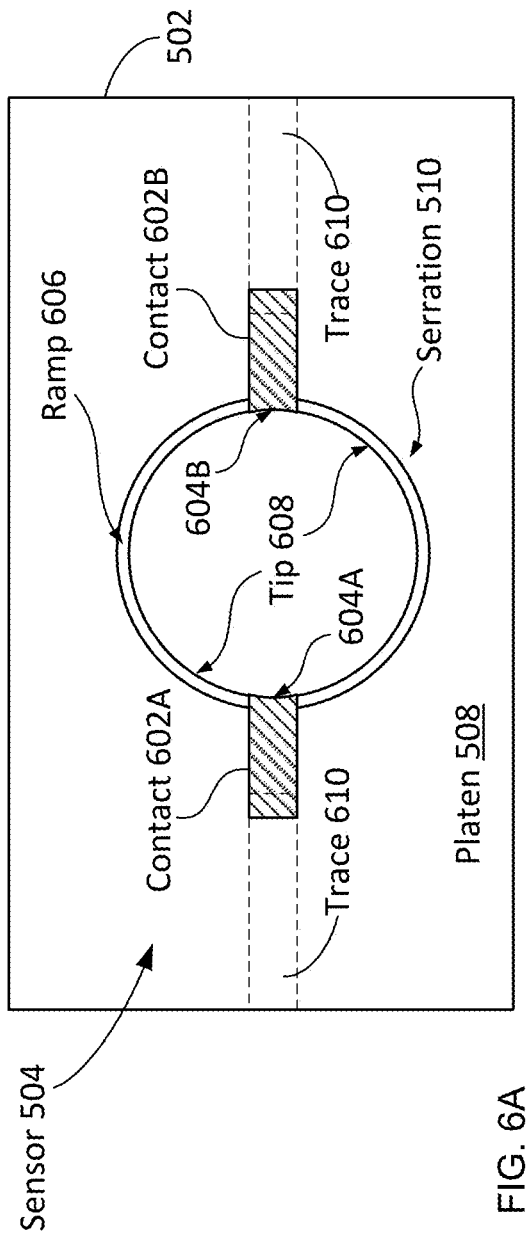
FIGS. 6A-B depict schematic drawings of top and cross-sectional views, respectively, of a representative impedance sensor in accordance with the illustrative embodiment.
Figure 6B:
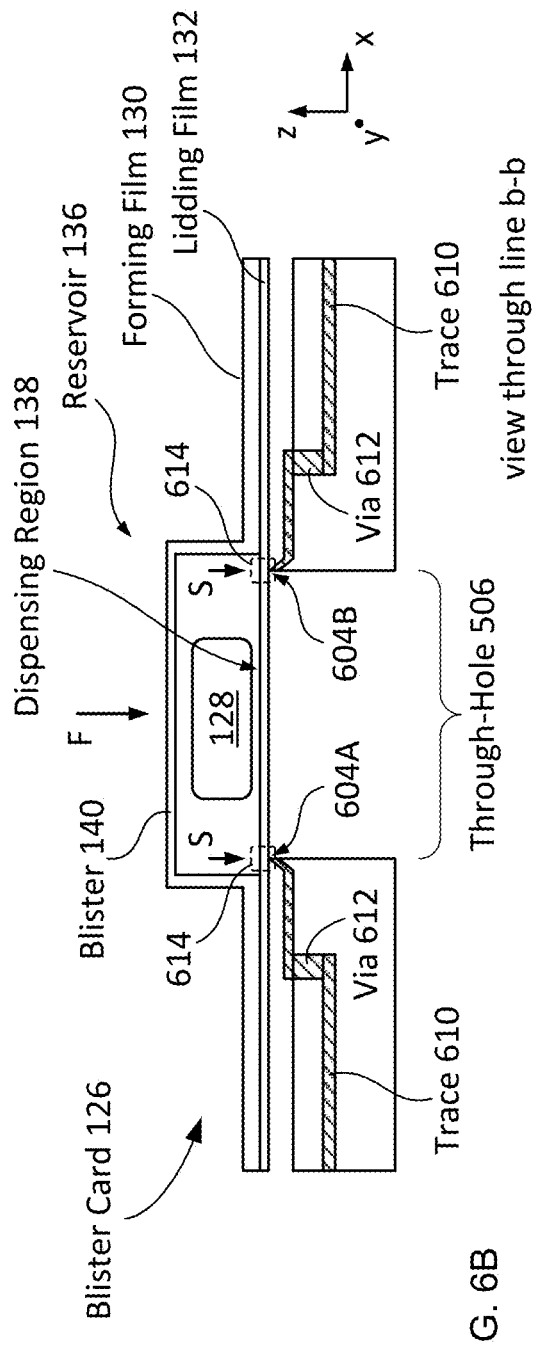

FIGS. 6A-B depict schematic drawings of top and cross-sectional views, respectively, of a representative impedance sensor in accordance with the illustrative embodiment. Sensor 504 is representative of each of sensors 504-1 through 504-28. FIG. 6B depicts sensor 504 as operatively coupled with blister card 126.

Substrate 502 is a substrate suitable for supporting the fabrication of sensors 504-1 through 504-28 (referred to, collectively, as sensors 504). In the depicted example, substrate 502 is a conventional, multi-layer printed-circuit board (PCB). In some embodiments, substrate 502 is a different substrate, such as a semiconductor substrate, ceramic substrate, plate of composite material, and the like. In some embodiments, substrate 502 comprises a flexible material or is incorporated into a different surface of case 100 (e.g., its lid, back surface, etc.) by, for example, embedding components into the material of housing 302, printing electronic elements on the surface itself, and the like. In some embodiments, substrate 502 is incorporated into frame 304. In some embodiments, sensor array 118 is incorporated into lid 318 such that sensors 504 are capacitively coupled with lidding film 132 through forming film 130 when the lid is closed. In the latter two examples, electrical interconnections to substrate 502 accommodate hinged operation of the mechanical component.

The top surface of substrate 502 (i.e., platen 508) functions as a hard surface against which blister card 126 rests. As such, sensor array 118 resides between seat 306 and blister card 126 such that each of sensors 504 is operatively coupled with a different dispensing region 138 of lidding film 132 when the blister card is secured by receiver 116. In some embodiments, sensor array 118 is integrated into seat 306 (i.e., seat 306 also serves as substrate 502).

Each of sensors 504 is an impedance sensor comprising metal traces formed on platen 508. The metal traces terminate at through-hole 506 to define contact points 604A and 604B.

Through-holes 506 are apertures formed through the thickness of substrate 502 to allow for the passage of tablets 128 through detection module 104 when dispensed from blister card 126.

It should be noted that, in the prior art, the lateral stresses that manifest at lidding-film 132 when a blister is being pushed (to dispense a tablet) are relatively low compared to the fracture stress of the lidding film. As a result, the lidding film can deform substantially before any rupture occurs and the magnitude of force that must be applied by the user to induce rupture of the lidding film can be significant. Accordingly, it can be difficult for some users to dispense a tablet from a blister card. This challenge can be particularly acute for some senior citizens, those on other medications (e.g., diabetes, cholesterol, hypertension, etc.), as well as many others.

It is an aspect of the present disclosure, however, that dispensing a product from a blister card can be made easier by concentrating the force applied to a blister into larger localized lateral stresses in the lidding film to initiate fracture. This stress concentration is achieved by including serrations 510 at the inside edge of through-holes 506.

In the depicted example, each serration 510 includes ramp 606, which projects upward from platen 508 to form a continuous sharp edge (i.e., tip 608) around the perimeter of each through-hole.

When force F is applied to tablet 128 through blister 140 (e.g., using a finger, a stylus, etc.), lidding film 132 is pressed against serration 510. This concentrates the force applied to the relatively larger area of blister 140 and tablet 128 at tip 608, which has a relatively smaller area (i.e., pressure region 614). As a result, pressure, S, at lidding film 132 is magnified and easily initiates fracture of lidding film 132 in pressure regions 614. As a result, the magnitude of force F required to initiate fracture of lidding film 306 can be much lower than needed in the prior art.

In some embodiments, at least one of the geometry, number, distribution, and location of serration 510 is defined to effect a desired lidding film fracture at a predetermined magnitude of force F and/or subsequent fracture/tear propagation path. In some embodiments, serration 510 is discontinuous around the perimeter of through-hole 506. In some embodiments, serration 510 has an upper edge that has undulations and/or discrete sharp features that concentrate the applied force into smaller areas of the lidding film.

Typically, the configuration of ramp 606 is selected to provide sufficient cutting capability without sacrificing strength. In some embodiments, ramp 606 is configured such that it creates a stress concentration in lidding film 132 that provides efficient cutting action while also mitigating the potential for injury to the finger of a user as tablet 128 is pushed through the lidding film.

In some embodiments, tip 608 is analogous to the sharp edge of a different cutting element, such as a serrated knife, a saw blade, and the like, or any combination thereof. In other words, in some embodiments, tip 608 includes features having one or more of puncturing and cutting geometries and arrangements used in knives, blades, puncturing tools, and the like. In some embodiments, serration 510 has elements distributed radially from the through-hole 506.

Figure 6C:
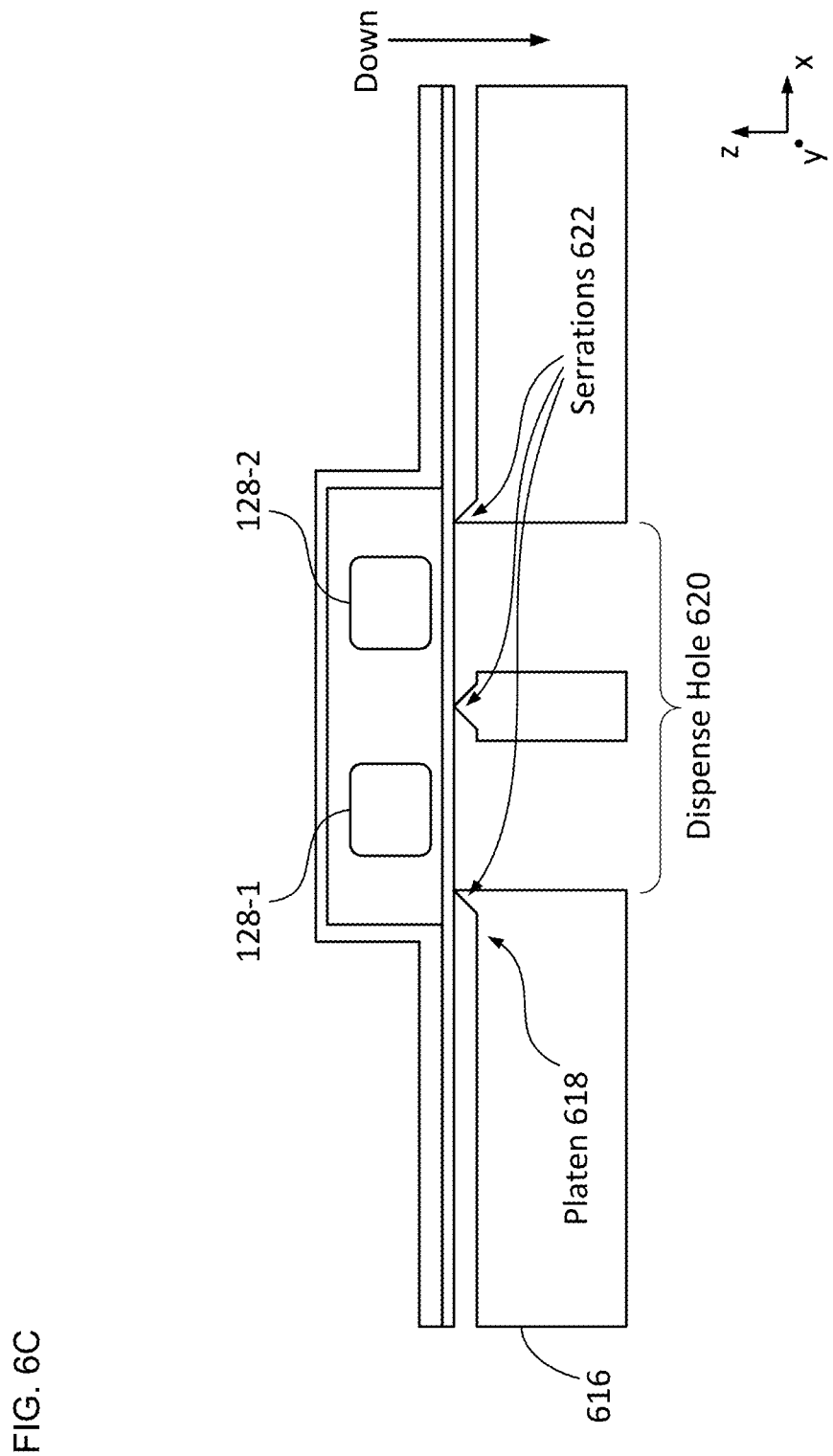
FIG. 6C depicts a case bottom that includes a divided dispense hole in accordance with an alternative embodiment of the present disclosure.

FIG. 6C depicts a case bottom that includes a divided dispense hole in accordance with an alternative embodiment of the present disclosure. Case bottom 616 includes platen 618, dispense hole 620, and serration 622.

In the depicted example, serration 622 is analogous to serration 510 described above; however, serration 622 includes portions that are located around the peripheries of each of the divisions of dispense hole 620.

It should be noted that, in some embodiments, dispense hole 620 is singular (i.e., without divisions) even when a blister site contains more than one tablet.

Figure 6D:
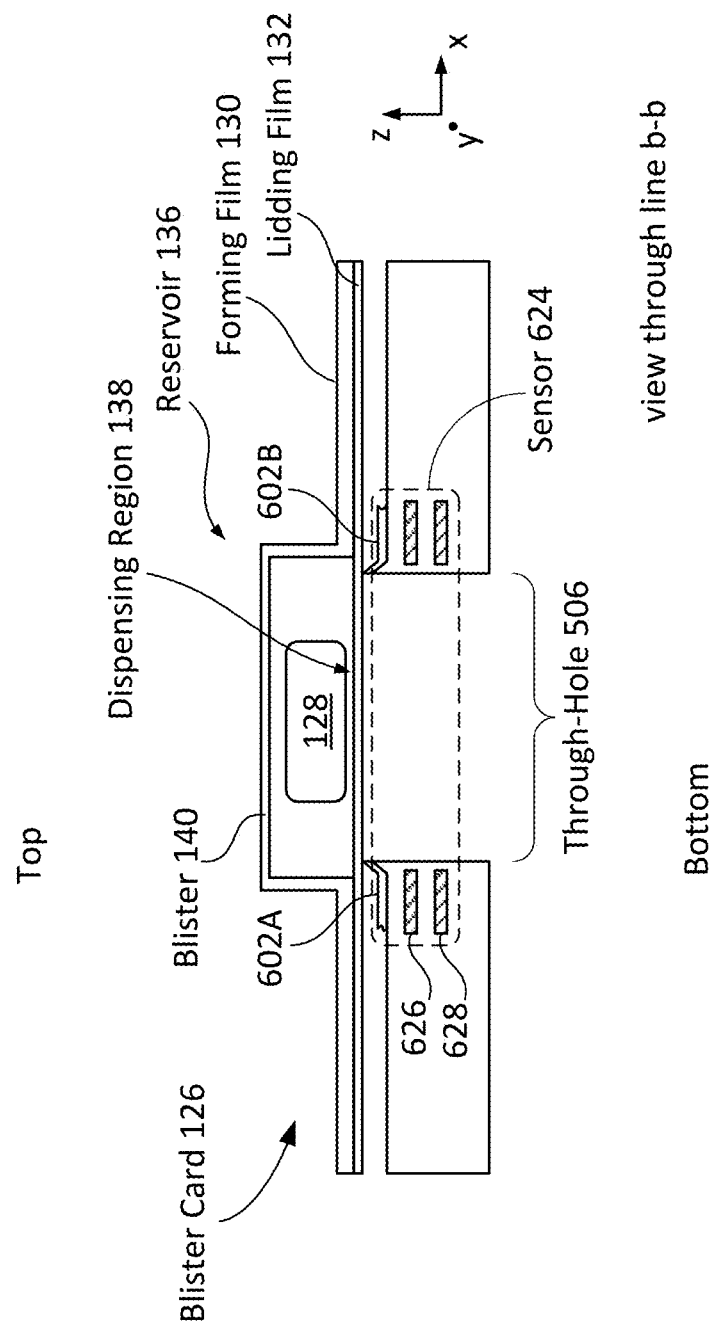
FIG. 6D depicts a cross-sectional view of an alternative sensor in accordance with the present disclosure.

FIG. 6D depicts a cross-sectional view of an alternative sensor in accordance with the present disclosure. Sensor 624 is a capacitive sensor whose output signal is based on the state of dispensing region 138. Sensor 624 includes contacts 602A and 6026, electrode 626, and electrode 628. Sensor 624 is analogous to high-noise-immunity capacitive sensors described in U.S. patent application Ser. No. 15/223,779.

Each of electrodes 626 and 628 is formed within substrate 502 such that it is a planar, circular metal electrode that completely surrounds through-hole 506 and is parallel with platen 508. Electrodes 626 and 628 are formed such that electrode 626 is between lidding film 132 and electrode 628 when blister card 126 is located in receiver 116. In this state, electrode 626 and dispensing region 138 collectively define a capacitor whose capacitance defines the output signal of sensor 624, where the value of its capacitance is based on the state of dispensing region 138.

Contacts 602A and 602B are electrically connected to ground through traces 610 (not shown). As a result, when the blister card is located in the receiver, lidding film 132 is grounded and functions as a ground plane that mitigates the effects of noise and interference on the sensor that originates from the top side of blister card 126. For the purposes of this Specification, including the appended claims, an "electrical shield" is defined as an element that mitigates the effects of stray capacitance, electrical noise, and electrical interference on an electrical parameter measured at another element. It should be noted that sensor 624 can include any practical number of contacts 602 (e.g., one, three, ten, etc.) without departing from the scope of the present disclosure.

In the depicted example, electrode 628 is also electrically connected to ground and, therefore, functions as a ground plane that defines another electrical shield, which mitigates the effects of noise and interference on the sensor that originates from the bottom side of blister card 126.

In some embodiments, in order to further mitigate the effects of noise and interference, at least one of electrodes 626 and 628 is segmented into a pair of half-rings. In some embodiments, at least one of electrodes 626 and 628 is segmented into more than two circumferential sections. In some embodiments, an electrically grounded shield line is formed in the plane of electrode 626, where the shield line substantially surrounds the electrode, thereby functioning as a third electrical shield that mitigates the effects of laterally directed noise and interference on the sensor.

It should be noted that the blister plastic and the lidding aluminum films have very different material and structural properties. The blister is far more resistant to puncture and tear than the lidding film. Typically, therefore, serrations can be designed to puncture and tear the lidding film without significantly damaging the blister, which enables a user to safely push a pill through its blister without risking injury to their fingers.

At operation 408, electronics module 102 transmits status signal 122 to external device 120. Status signal 122 includes the status of dispensing regions 138, as well as the date and time at which smart case 100 was opened. In some cases, status signal 122 includes an indication of a change in one or more of the dispensing regions from their condition at the most recent previous determination of their states. If the external device 120 is not in range, the status signal is stored in memory 212 and transmitted to external device 120 at some point in the future when external device 120 is in range.

In some embodiments, a stylus for applying force to a blister is included to further ease the process of dispensing a tablet.

Figure 7:
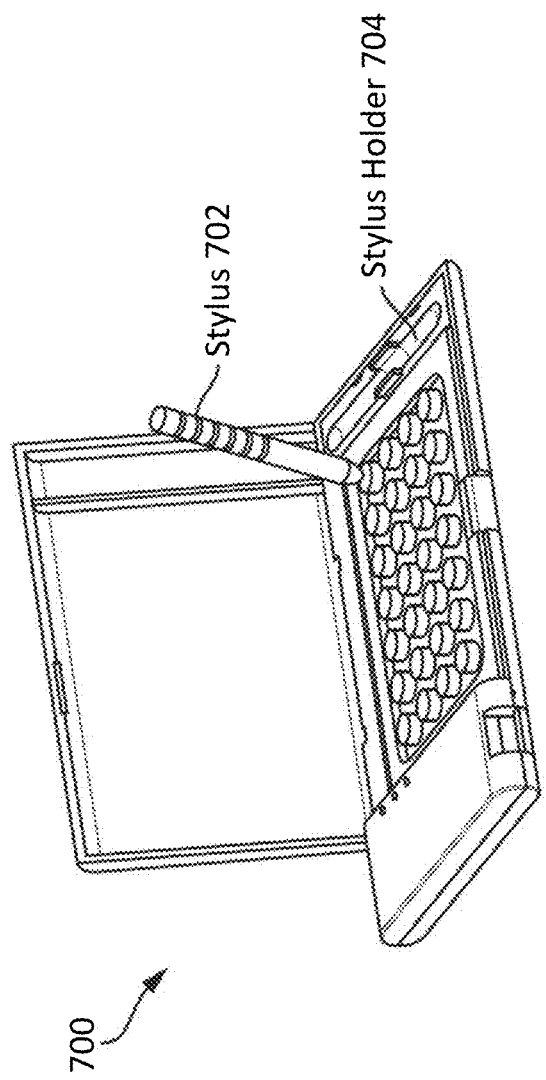
FIG. 7 depicts a schematic drawing of a non-modular smart case that includes a stylus for applying force to a blister of a blister card.

FIG. 7 depicts a schematic drawing of a non-modular smart case that includes a stylus for applying force to a blister of a blister card. Case 700 is analogous to case 100; however, case 700 includes stylus 702 and stylus holder 704, which holds stylus 702 in the case when it is not in use.

Figure 8:
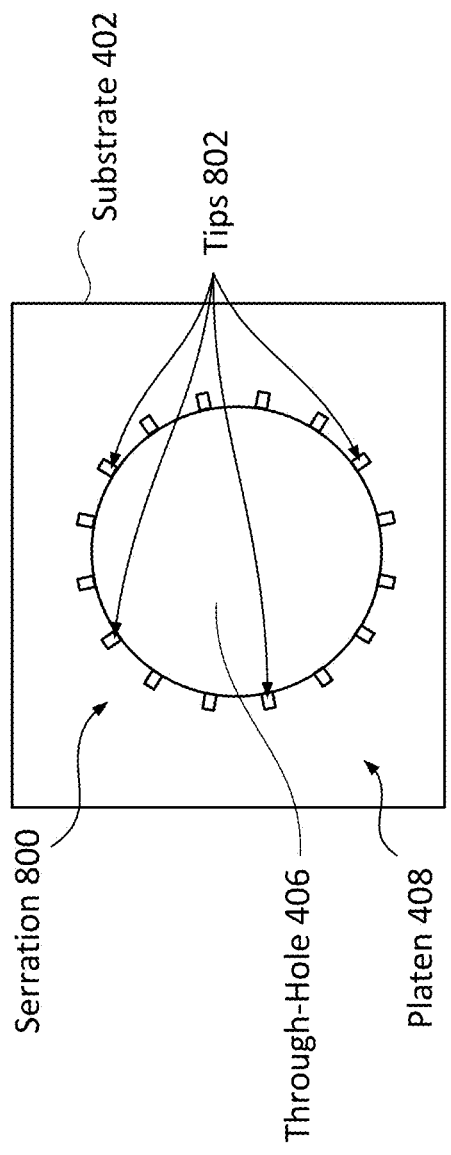
FIG. 8 depicts a schematic drawing of a top view of an example of an alternative serration in accordance with the present disclosure.

FIG. 8 depicts a schematic drawing of a top view of an example of an alternative serration in accordance with the present disclosure. Serration 800 includes a plurality of discrete tips 802, which are arranged around the perimeter of through-hole 506.

Each of tips 802 is a sharp projection that concentrates puncture stresses into smaller regions of lidding film 132. One skilled in the art will recognize, after reading this Specification, that tips 802 can have myriad configurations over one or more similar or differing arc-segments of the periphery of through-hole 506. For example, including only one tip 802 at the periphery of through-hole 506 will give rise to the lidding film being punctured at its location, where tearing of lidding film 132 will initiate. Discrete serrations, such as serration 800, can also incorporate puncturing and cutting geometries and arrangements used in knives, blades, puncturing tools, and the like.

It should be noted that puncturing of the lidding film can be initiated at one or more locations and the subsequent tearing of the lidding film can then be guided through relative placement of other tips 802 along an arc or (extrapolated) radius of through-hole 506 periphery. For example, a single point of puncture by an individual cone- or pyramid-shaped serration tip can be located at the periphery of through-hole 506, while additional, shorter serration tips can be located to one or the other (or both) side(s) of the individual tip over a desired arc length. The taller individual point will effect puncture of the lidding film as pressure/force is applied to blister 140. After this initial puncture, the remaining shorter serrations will give rise to tearing of the lidding film in their direction.

Furthermore, serration tips may be placed in locations that are located radially away from the periphery of through-hole 506, including in combination with others at the periphery of through-hole 506. Such design flexibility enables additional degrees of freedom in initiating and propagating tearing of the lidding film. By way of example, a ring of serrations placed away from through-hole 506 periphery—but still under the blister site's lidding film membrane when the through-hole 506 is smaller than dispensing region 138 but large enough to allow tablets 128 through—will result in tearing of a larger area of lidding film 132.

Alternatively, serration tips can be located at radially opposite sides of a through hole such that the serrations radially emanate away from the through hole, which will drive tearing of the lidding film along the line along the opposing radial serrations. By moving the opposing radial serrations off center with respect to the through-hole's center, the tear across will move off center correspondingly.

One skilled in the art will recognize, after reading this Specification, that myriad combinations of geometry, number, distribution, and location of serration tips and/or serrations exist for driving specific goals in initiating and propagation tearing of the lidding film. Furthermore, serrations/tips located at the periphery of a dispense hole may be fabricated in the plane of the hole or at any angle to it. There are also myriad of ways to fabricate these serrations, including from hard plastics, glass, metal, ceramic, and the like. For example, the serrations may be realized as part of the fabrication of the surface of seat 306 on which the blister card rests. This surface may be the inside surface of the bottom structure of the smart case itself, when this bottom structure also incorporates the sensing provisions. Alternatively, the serrations may be fabricated as part of a separate surface upon which the blister card rests—with this new surface resting on seat 306 or a PCB incorporating the sensing provisions and also constituting seat 306. In some embodiments, the serrations are fabricated onto the surface of a PCB that includes the sensing provisions and also constitutes platen 508. Alternatively, serrations/tips may be fabricated separately and assembled onto any such platen.

Returning now to FIGS. 5-6, sensor 504 includes contacts 602A and 602B, which are metal traces formed on the top surface (i.e., platen 508) of substrate 502. Contacts 602A and 602B terminate at through-hole 506 to define contact points 604A and 604B, which reside on serration 510.

The state of dispensing region 138 is determined by measuring the resistance between contact points 604A and 604B when they are in physical and electrical contact with lidding film 132. It should be noted that the increased pressure realized by virtue of serration 510 also improves the electrical connection between contact points 604A and 604B and lidding film 132.

Electrical connection between contact points 604A and 604B and electronic circuitry 112 is established by connecting contacts 602A and 602B to traces 610 and vias 612, which are metal features formed within the body of substrate 502 in conventional fashion.

Although the illustrative embodiment includes sensors that measure the resistance across their respective dispensing regions using two contact points, in some embodiments, the impedance of a dispensing region is measured using a sensor having a different number of contact points, each of which is electrically connected to measurement electronics (e.g., electronic circuitry 112, located on substrate 502, etc.) via contacts, vias, and traces, as described above.

Figure 9C:
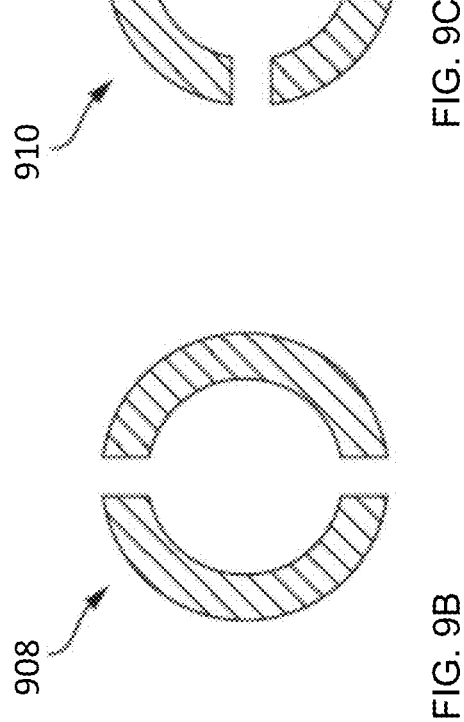
FIGS. 9A-C depict schematic drawings of top views of alternative arrangements of contact points in accordance with the present disclosure.
Figure 9B:
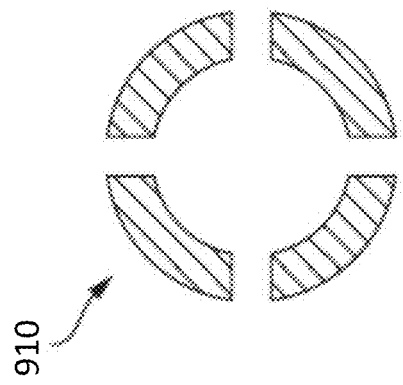
Figure 9A:
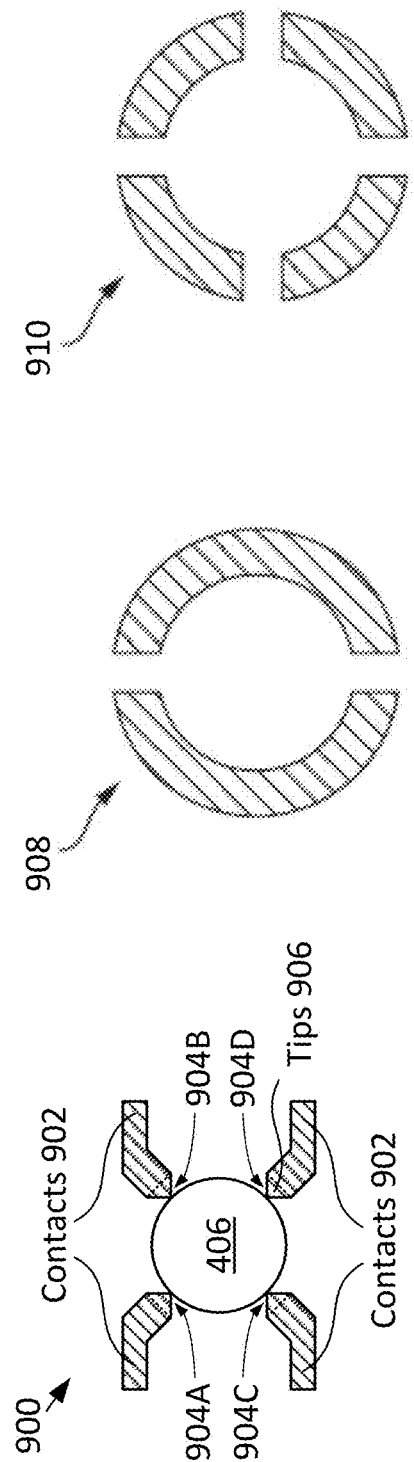

FIGS. 9A-C depict schematic drawings of top views of alternative arrangements of contact points in accordance with the present disclosure.

Arrangement 900 includes four contacts 902, which terminate at through-hole 506 at contact points 904A, 904B, 904C, and 904D.

Contacts 902 are analogous to contacts 602A and 602B described above and are configured such that contact points 904A, 904B, 904C, and 904D are distributed around through-hole 506 in a substantially square arrangement. The arrangement of contact points 904A, 904B, 904C, and 904D enables four-point probe measurement of dispensing region 138, as well as other impedance measurement techniques.

In the depicted example, each of contact points 904A, 904B, 904C, and 904D is disposed on a tip 906, which are each analogous to tips 702 described above.

Arrangement 908 is an alternative contact arrangement that enables simple impedance measurement of dispensing region 138.

Arrangement 910 is an alternative contact arrangement that enables simple impedance or, alternatively, four-point probe measurement of dispensing region 138.

It should be noted that the contact and contact point shapes and arrangements shown in FIGS. 9A-C represent only a few examples of alternative arrangements of contacts, contact points, and serration tips in accordance with the present disclosure. The shape, size, number and arrangement of contacts, contact points, and/or serration tips can be selected to realize a wide range of desired sensing sensitivity and reliability, as well as sensing power consumption considerations.

It should be noted that, in some embodiments, blister card 126 includes an electrically insulating layer (e.g., cardboard, plastic, etc.) that resides over the exposed surface of lidding film 132. In such embodiments, contacts 602, as well as connectors 336, are not in direct physical and electrical contact with lidding film 132 when blister card 126 is located in detection module 104. In such cases, contacts 602 and connectors 336 are capacitively coupled with the lidding film.

Although sensor array 118 employs impedance-sensing technology to monitor the state of blister card 126, many alternative sensing technologies can be employed in detection module 104 without departing from the scope of the present disclosure. Sensing technologies suitable for use in embodiments in accordance with the present disclosure include, without limitation, capacitive sensing, strain sensing, optical sensing, acoustic sensing, tactile sensing, thermal sensing, and magnetic sensing, among others.

Furthermore, in some embodiments, the state of a region within lidding film 132 is determined by imaging the region via electrical impedance tomography (EIT) rather than simple direct impedance measurement. Using EIT, the resistance (or impedance) distribution within the region can be determined via a plurality of connectors arranged about at least a portion of the periphery of the region.

Figure 10:
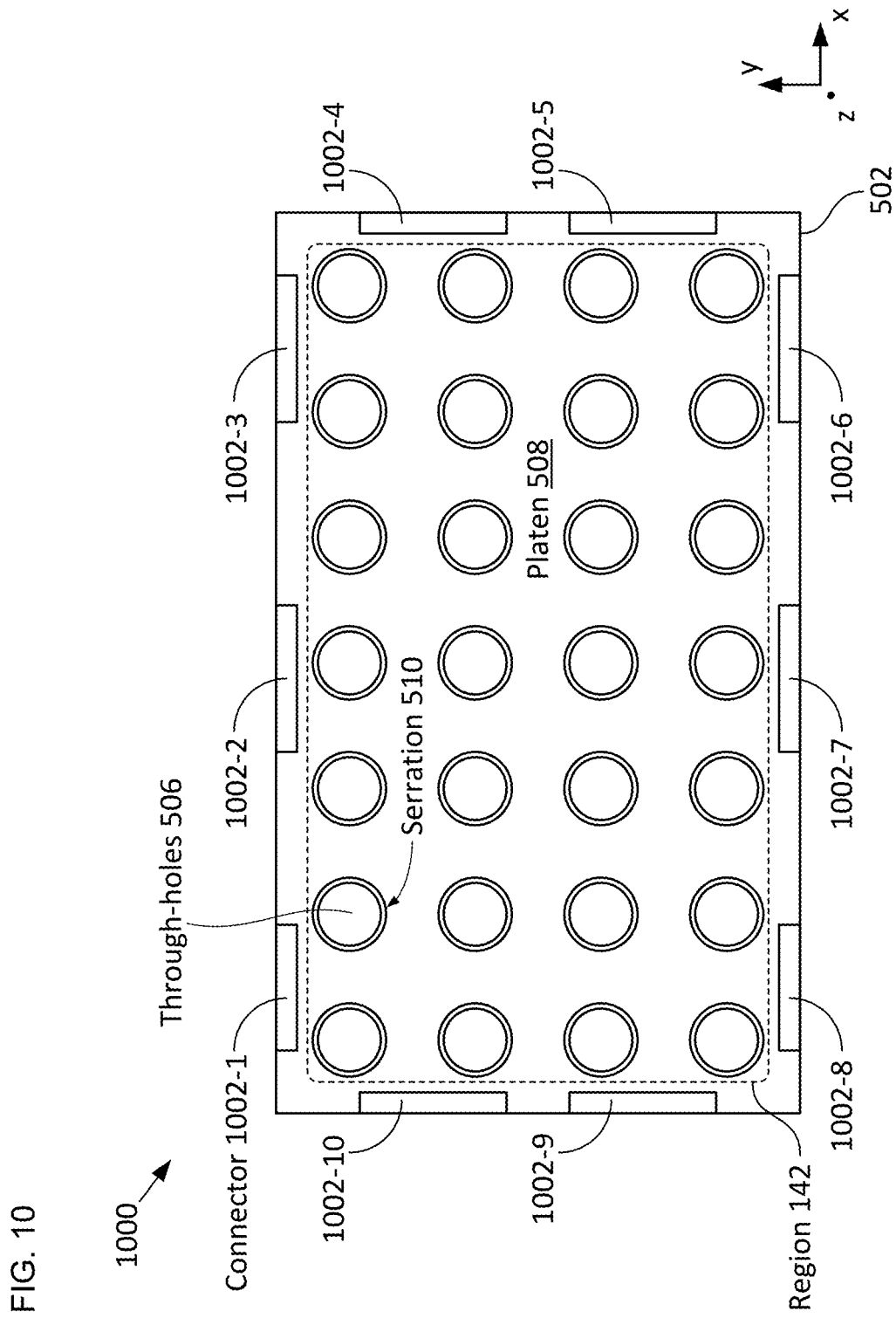
FIG. 10 depicts a schematic drawing of a cross-section of a sensor array configured to monitor the state of a blister card via electrical impedance tomography.

FIG. 10 depicts a schematic drawing of a cross-section of a sensor array configured to monitor the state of a blister card via electrical impedance tomography. Sensor array 1000 includes connectors 1002-1 through 1002-10, which are arranged around the perimeter of substrate 502. It should be noted that any number and areal distribution (i.e., distribution over the area of blister card 126) of connectors can be used in sensor array 1000 without departing from the scope of the present invention. In some embodiments, sensing of aggregate resistance changes of the card's lidding film is measured by only have two connectors—on opposing sides—to determine if and how many tablets are dispensed.

Each of connectors 1002-1 through 1002-10 (referred to, collectively, as connectors 1002) is analogous to connectors 336 described above and with respect to FIGS. 4A-D; however, connectors 1002 are configured to enable insertion of blister card 126 into seat 306 without significant deformation of the blister card. In some embodiments, connectors 1002 are "zero-insertion-force" (ZIF) connectors that close over the blister card after it has been inserted.

In some embodiments, connectors 1002 are metal bumps on the surface on which blister card 126 rests. In some embodiments, such metal pumps are shaped as needles/probe tips that pierce blister card 126, making electrical contact to the blister card's lidding film and, at the same time, securing the blister card in place mechanically. In such embodiments, electrical contact to the lidding film would not be affected by out of plane movement of the blister card. At the same time, the protrusion of needle/probe-like connectors 1002 through the laterally stiff/tear-resistant forming film secures the blister card laterally.

As will be appreciated by one skilled in the art, electrical impedance tomography imaging and electrical resistance tomography (ERT) imaging (a.k.a., electrical resistance imaging (ERI)) are well-known techniques used for imaging tissue in medical applications, as described by Duraiswami, et al., in "Efficient 2D and 3D EIT using dual reciprocity boundary element techniques," Engineering Analysis with Boundary Elements, Vol. 22, pp. 13-31 (1998), and elsewhere. In such approaches, a forward model of a system is first developed by modeling the system for a plurality of potential configurations of a parameter of interest. These modeled configurations are then stored in a look-up table. An unknown parameter configuration is then reconstructed by making measurements of the system, whose results are then compared to those predicted by the stored models. Typically, an iterative algorithm is used in doing so, identifying features of interest in the measured system.

To develop an image of region 142 of lidding film 132 within using EIT, pair-wise measurements of the impedance between pairs of connectors 1002 are made by generating an electric stimulus (in the present example, an electric current) between a first pair of connectors that serve as the current source and sink. The voltage potential between each other pair of terminals is then measured to determine the potential difference between their respective locations. In such embodiments, for a system with N terminals there are approximately $N^4$ different terminal configurations. Such pair-wise measurements are analogous to ERT methods described by LaBrecque in U.S. Pat. No. 8,733,432 and EIT measurements described by Duraiswami, et al., in "Efficient 2D and 3D EIT using dual reciprocity boundary element techniques," each of which is incorporated herein by reference.

For example, LaBrecque discloses, " . . . in ERT, each measurement uses four electrodes; one pair of electrodes serves as the current source and sink and a second pair measures the potential difference between two points. For a system with N electrodes there are approximately $N^4$ different configurations referred to as arrays." In similar fashion, Duraiswami discloses, "In electrical impedance tomography (EIT) the distribution of impedances inside an object ('image') is sought by applying specified currents at some electrodes, and performing measurements of the voltage at other electrodes. The equations for the electric field then provide a relationship between the impedance distribution inside the medium and the measured voltages and applied currents. Different kinds of materials have different impedances, and the availability of an impedance map provides an image of the material Distribution." One skilled in the art will recognize that ERT and EIT measurements, such as those described by LeBrecque and Duraiswami, are suitable for use in embodiments of the present invention.

Figure 11:
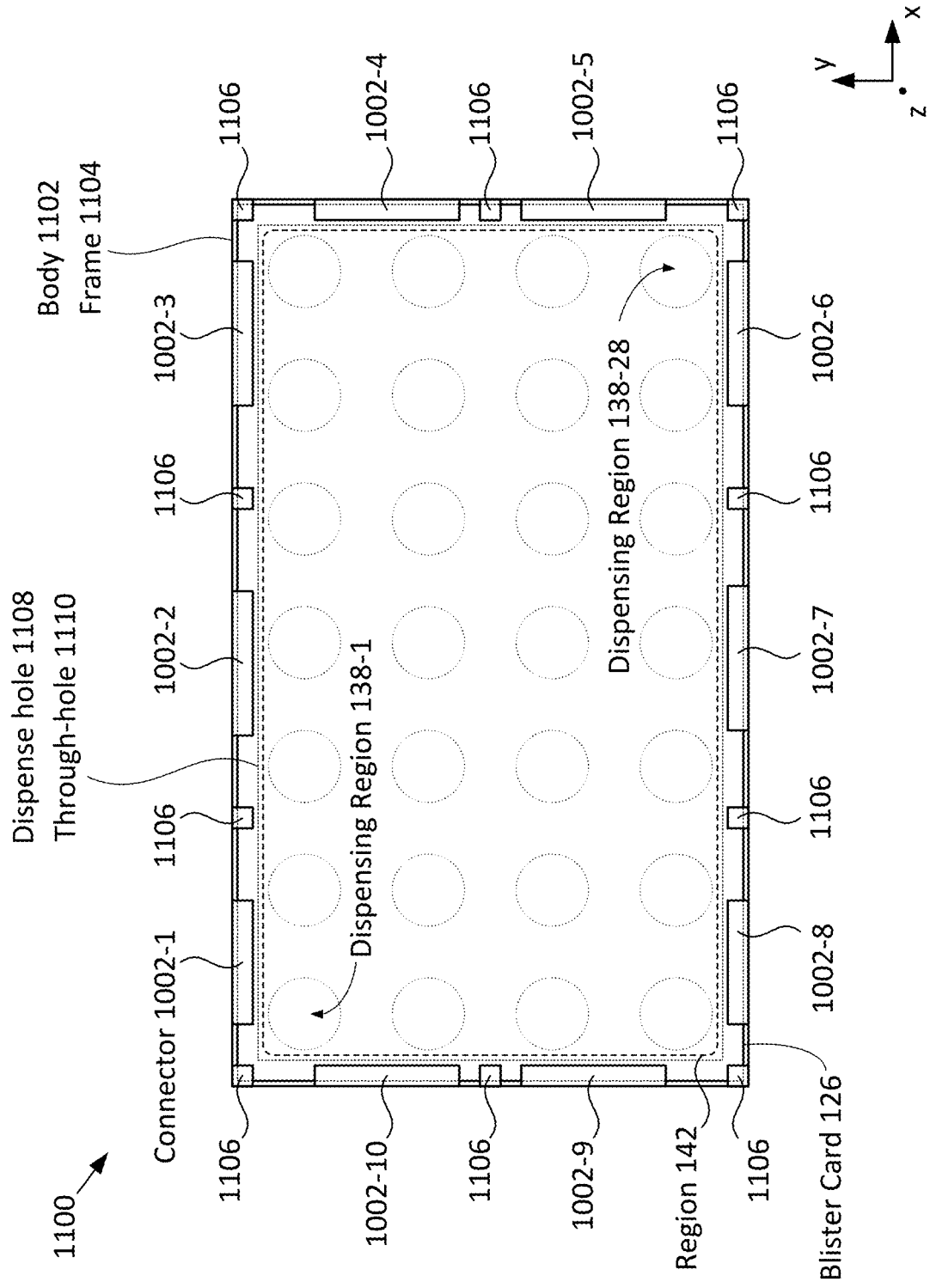
FIG. 11 depicts a schematic drawing of a top view of an alternative smart case in accordance with the present disclosure.

FIG. 11 depicts a schematic drawing of a top view of an alternative smart case in accordance with the present disclosure. Smart case 1100 includes body 1102, frame 1104, connectors 1002-1 through 1002-10, and anchors 1106. Smart case 1100 is depicted as operatively coupled with blister card 126.

Body 1102 is analogous to body 316 described above; however, body 1102 is a rectangular annulus having a single central opening that defines a single dispense hole 1108. Dispense hole 1108 is analogous to each dispense holes 320 described above. In the depicted example, dispense hole 1108 is large enough to extend completely around region 142 of blister card 126.

Frame 1104 is analogous to sensor array 118 described above; however, frame 1104 is a rectangular annulus of structural material having a single central opening (i.e., through-hole 1110) and does not include individual sensors at each dispense region of blister card 126. In the depicted example, through-hole 1110 is the same size as dispense hole 1108. As a result, dispensing regions 138-1 through 138-28 (indicated by dashed-line circles) all reside within the perimeter of each of dispense hole 1108 and through-hole 1110.

In some embodiments, at least one of body 1102 and frame 1104 includes ribs along the x- and/or y-directions (or other directions) that define a plurality of sub-openings within the central opening of their annuli. Typically, each such sub-opening is large enough to surround more than one tablet region of blister card 126. As a result, the different portions of the blister card would be analogous to a plurality of "diaphragms," each suspended over a different sub-opening.

Each of anchors 1106 is a fastener that holds a different portion of blister card 126 and disables lateral motion of that portion. In the depicted example, each anchor 1106 is a pin that pierces both lidding film 132 and forming film 130. In some embodiments, at least one of anchors 1106 is a different type of fastener, such as a screw, a clamp, and the like.

Anchors 1106 mitigate lateral motion and/or buckling of the unsupported portion of blister card 126 when force is applied to one or more blisters 140.

It should be noted that, in embodiments wherein body 1102 and/or frame 1104 define(s) a plurality of sub-openings, anchors 1106 may be additionally or exclusively located along the perimeter of each of the sub-openings to affix the edge of each of the "diaphragms" in place.

In some embodiments, the functionality of each of connectors 1004 and anchors 1106 is combined into a single element that both fastens a portion of the blister card in place and makes electrical contact with the lidding film at the location of the element.

In some embodiments, frame 1104 is not included and connectors 1002 are disposed directly on body 1102.

In some embodiments, connectors 1004 are disposed on a separate substrate that functions as a platen as described above and with respect to substrate 502 of sensor array 118.

In some embodiments, anchors 1106 are located on the surface of body 1102 against which blister card 126 rests, piercing through blister card 126 from the lidding film side. In some embodiments, anchors 1106 are located on the underside surface of frame 1104, piercing through blister card 126 from the forming film side. In embodiments that include a platen, anchors 1106 are located on the surface of the platen against which blister card 126 rests, piercing through blister card 126 from the lidding film side.

It should be noted that, in some embodiments, more than one pill is included within a single blister site on a blister card.

Accommodating "Peel-Away" Blister Cards

Some blister cards are designed to make them more child proof using a multi-layer lidding film that is more difficult to rupture or tear. Typically, the layers include a metal foil (e.g., aluminum) on the inside, paper on the outside, and a thin polymer layer sandwiched in between the metal and paper. Such blister cards are referred to herein as "peel-away" blister cards. Typically, in a peel-away blister card, peeling the lidding film off is a central step to dispensing the contents of a blister—rather than pushing the tablet through the composite lidding film.

Embodiments in accordance with the present disclosure are suitable for use with peel-away blister cards, which are typically removed from the case to facilitate opening the desired blister site to dispense its content. Once the content has been dispensed, the blister card is re-inserted into the smart case. It should be noted that, since the blister content is not pushed through the case bottom, inclusion of dispense holes 320 and through-holes 506 is optional.

In some cases, peel-away blister cards include perforation lines to facilitate removal of a segment of the card corresponding to a dose. Once a dose portion is separated, the user peels off its lidding film to access its blister content. Each time a dose is dispensed, the user discards the corresponding segment of the blister card. In other words, the blister sites and their corresponding perforated segments vanish with each dose—leaving a smaller portion of the card behind. Accordingly, when a user removes the card from the case, separates a segment, and places the remainder of the card in the case, the change in the card can be detected by the case. In such cases, the separated segment may be thought of as an empty blister site void of any lidding film.

Accommodating Medication Packages Other than Blister Cards

One skilled in the art will appreciate that a flat, rectilinear content compartment is substantially a special shape of a bottle, vessel, vial, tub, tube, pouch, can, cartridge, and the like. Accordingly, the use of the smart case is not limited to blister-card formats and a single large content compartment can be used to contain loose pills (of one or more medicines), liquids, gels, syrups, suspensions, powders, pastes, creams, strips, vapor, spray, and the like. Depending on the electrical properties of the medication content (e.g., dielectric or conductive), the EIT sensing techniques described above, as well as a variation of EIT sensing, namely, electrical capacitance tomography (ECT) sensing, can be used to monitor the state of the content.

ECT is used to determine the distribution of the contents of a vessel by measuring the related permittivity distribution through the volume of the content compartment, which can be used to extract the number and/or shapes/features of a quantity of pills or other material it contains. This enables the addition or removal of pills/material to be monitored, as well as identification of the type of material introduced/removed. The requisite capacitance measurements for ECT are achieved by using a plurality of connectors that surround at least a portion of the volume to be imaged, as depicted in FIG. 10 above. In some embodiments, a region to be imaged is surrounded by one or more circumferential sets of connectors and the electrical capacitances between all combinations of the connectors within each set are measured. This information is then used to construct an image of the content of the cross section of the vessel enclosed by the connectors, based on variations in the permittivity of the material inside the vessel.

Figure 12A:
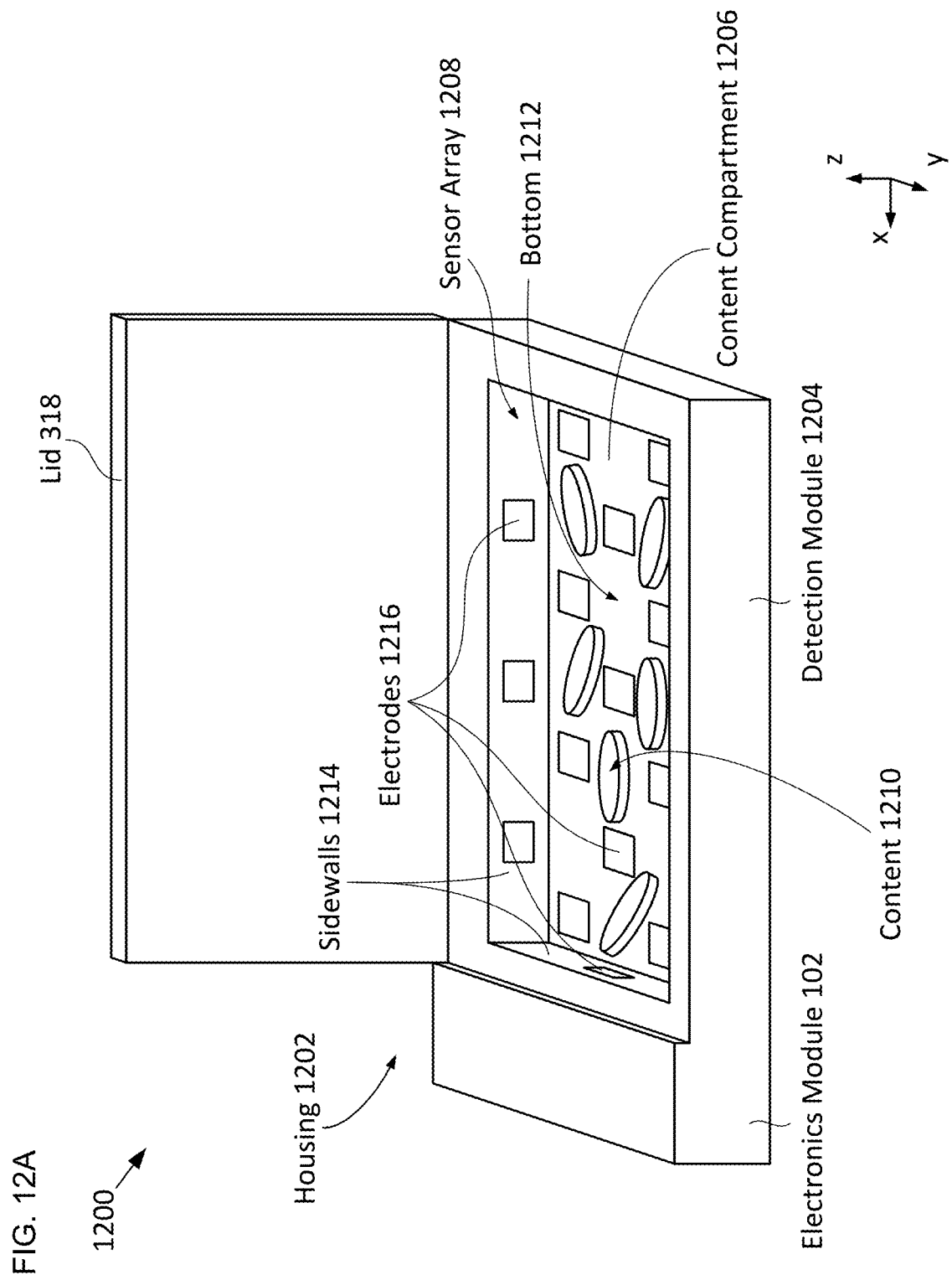
FIG. 12A depicts a schematic drawing of a perspective view of an alternative smart case that is configured for monitoring the contents of a single, large-area reservoir content compartment in accordance with the present disclosure.

FIG. 12A depicts a schematic drawing of a perspective view of an alternative smart case that is configured for monitoring the contents of a single, large-area reservoir content compartment in accordance with the present disclosure. Case 1200 is a non-modular smart case that includes housing 1202, electronics module 102, and detection module 1204. In some embodiments, case 1200 is modular, as described above and with respect to case 100.

Detection module 1204 includes content compartment 1206 and sensor array 1208.

Content compartment 1206 is a large-area reservoir suitable for holding content 1210 and includes bottom 1212 and four sidewalls 1214. In the depicted example, bottom 1212 is a substantially flat (i.e., planar) surface.

In the depicted example, content 1210 comprises loose tablets of a single type of medication; however, in some embodiments, content 1210 includes a different medicinal content, such as a plurality of tablet types (e.g., different medications, different tablet sizes and/or shapes, etc.), gels, liquids, powders, creams, pastes, strips, and the like. Furthermore, in some embodiments, content compartment 1206 is configured to accept a peel-away blister card that contains one or more tablets and/or tablet types. Still further, in some embodiments, content compartment 1206 is configured to hold non-medicinal content, such as breath mints, chewing gum, and/or other product units.

Sensor array 1208 includes a plurality of electrodes 1216, which is arranged such that the electrodes surround around at least a portion of the content compartment. In the depicted example, electrodes 1216 are embedded in bottom 1212 and in each of the sidewalls of content compartment 1206, which comprise a dielectric material (e.g., plastic, glass, etc.).

In some embodiments, electrodes 1216 are arranged in a different arrangement about content compartment 1206. For example, in some embodiments, at least some of electrodes 1216 are disposed in or on lid 318.

Sensor array 1208 is electrically coupled with electronics module 102 such that the interior volume of content compartment 1206 can be monitored via ECT. ECT is preferably used to monitor materials having low electrical conductivity; however, analogous smart cases can also be used to monitor content that is electrically conductive via EIT techniques.

Figure 12B:
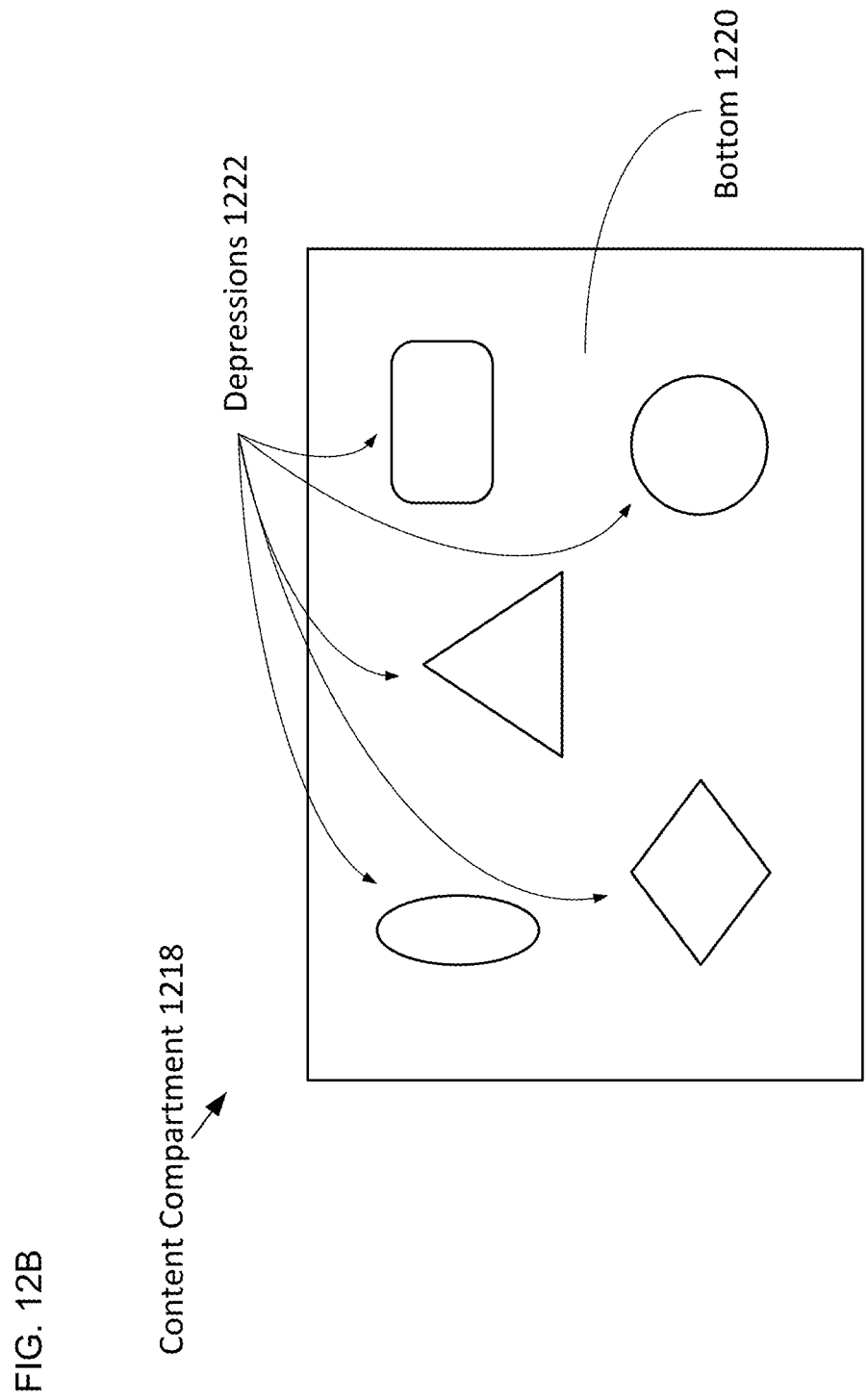
FIG. 12B depicts a schematic drawing of a top view of an alternative content compartment in accordance with the present disclosure.

FIG. 12B depicts a schematic drawing of a top view of an alternative content compartment in accordance with the present disclosure. Content compartment 1218 includes bottom 1220, which is analogous to bottom 1212; however, bottom 1220 includes recesses 1222.

Recesses 1222 define features suitable for capturing tablets that have matching size and shape. As a result, tablets can be simply poured into content compartment 1218 and shaped recesses 1222 will conveniently arrange them for the user without requiring them to be carefully placed into specific sites. In some such embodiments, one or more of these recesses includes its own sensing provisions, which can encompass virtually any of the sensing approaches described herein.

FIG. 13A depicts a schematic drawing of a perspective view of another alternative smart case that is configured for monitoring the contents of a single, large-area reservoir content compartment in accordance with the present disclosure. Case 1300 is analogous to case 1200; however, case 1300 includes detection module 1302, which is configured to monitor the contents of content compartment 1206 via simple parallel-plate capacitance sensing.

Detection module 1302 includes sensor array 1304, which is operatively coupled with electronics module 102. Sensor array 1304 comprises electrodes 1306-1 and 1306-2, which are disposed on bottom 1212 and surface 1308 of lid 318, respectively.

When lid 318 is closed, electrodes 1306-1 and 1306-2 collectively define a large parallel-plate capacitor whose capacitance is based upon the dielectric constant in the gap between the electrodes (i.e., the contents of content compartment 1206). Each time content is removed or added to content compartment 1206, the dielectric constant in the gap formed by the two electrodes changes, giving rise to a capacitance change related to the change in the content.

In some embodiments, the lid located on the side of the case's content compartment. For example, a side-positioned lid is preferable for a smart case configured to accept a pancake-like bottle.

In some embodiments, lid 318 comprises a sliding hinge rather than a rotational hinge, includes a cap that snaps on/off or screws on/off, and the like. In general, as used herein, the term "lid" denotes a means of controlling user access to content compartment 1206.

Figure 13B:
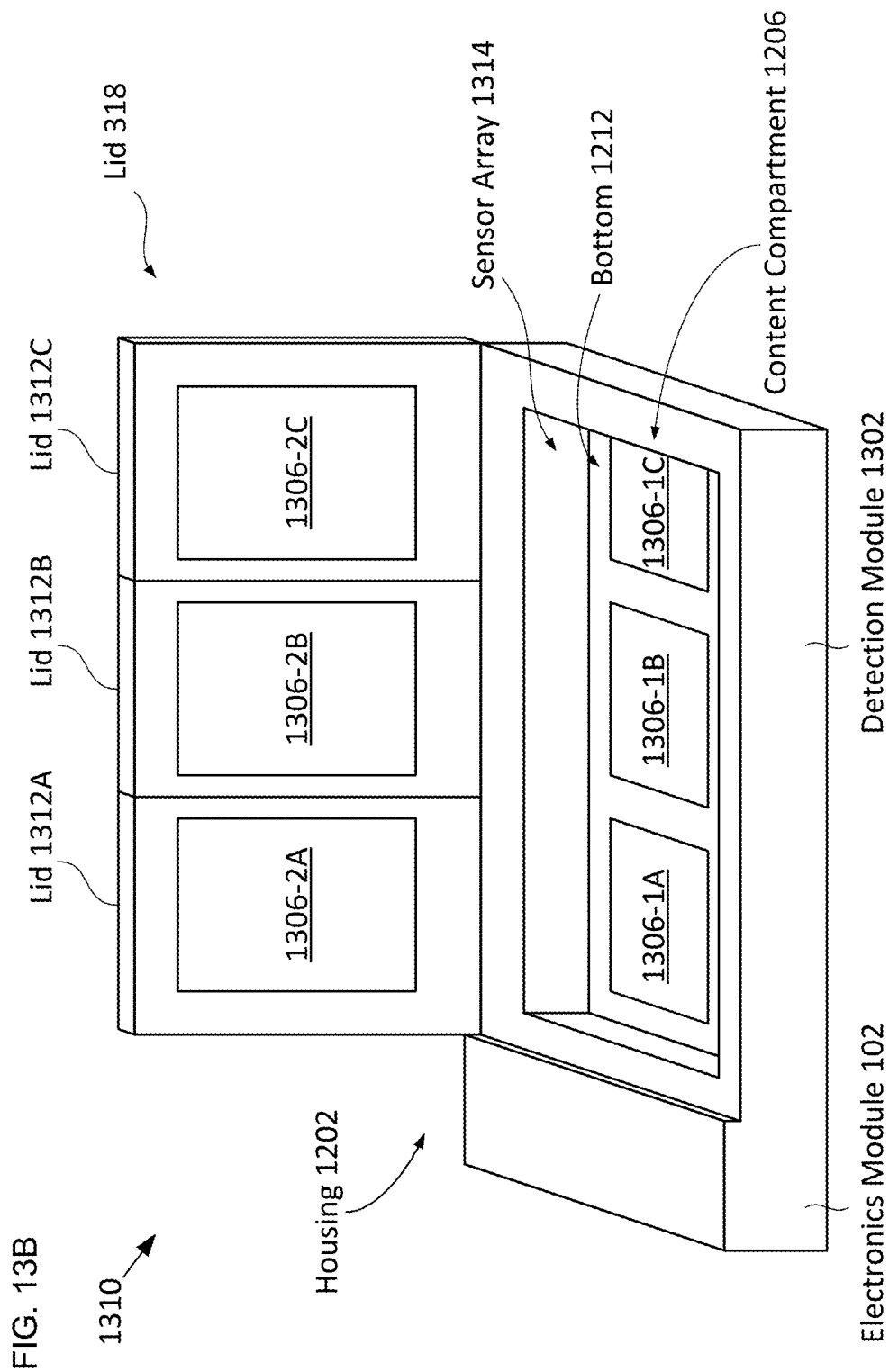
FIG. 13B depicts a schematic drawing of a perspective view of yet another alternative smart case that is configured for monitoring the contents of a single, large-area reservoir content compartment in accordance with the present disclosure.

FIG. 13B depicts a schematic drawing of a perspective view of yet another alternative smart case that is configured for monitoring the contents of a single, large-area reservoir content compartment in accordance with the present disclosure. Case 1310 is analogous to case 1300; however, case 1310 include a lid that is sub-divided into a plurality of lid sub-portions to discretize access to content compartment 1206. In addition, case 1310 includes sensor array 1314, which is configured to provide some measure of location information for content 1210.

In the depicted example, lid 318 is divided into lid sub-portions 1312A through 1312C. Typically, each lid sub-portion includes its own latch for securing it to housing 1202.

In addition, electrode 1306-1 is sub-divided into a plurality of smaller-area electrodes (i.e., sub-electrodes 1306-1A, 1306-1B, and 1306-1C) and electrode 1306-2 is sub-divided into a plurality of smaller-area electrodes (i.e., sub-electrodes 1306-2A, 1306-2B, and 1306-2C).

As a result, sensor array 1314 comprises a plurality of smaller area capacitors whose distribution provides locational information about content 1210 when it is contained in content compartment 1206. It should be noted that the electrical shielding considerations described earlier in this disclosure are similarly applicable here.

In some embodiments, only one of electrodes 1312-1 and 1312-2 is subdivided into two or more smaller-area electrodes.

Figure 14:
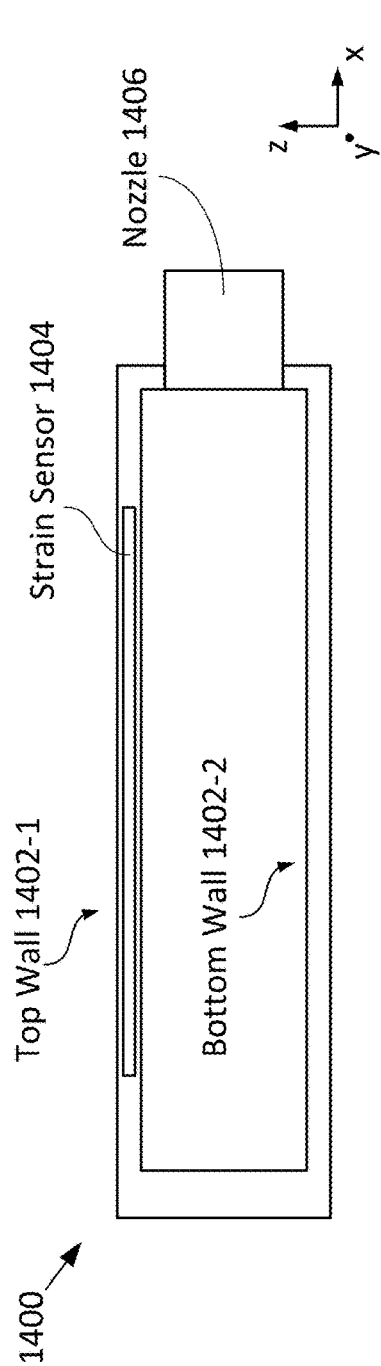
FIG. 14 depicts a schematic drawing of a cross-sectional view of an alternative content compartment in accordance with the present disclosure.

FIG. 14 depicts a schematic drawing of a cross-sectional view of an alternative content compartment in accordance with the present disclosure. Content compartment 1400 is configured to accept content in non-tablet form such as, without limitation, liquids, suspensions, vapors, sprays, and the like.

Content compartment 1400 includes top and bottom walls 1402-1 and 1402-2, strain sensor 1404, and nozzle 1406.

Each of top and bottom walls 1402-1 and 1402-2 comprises a resilient material (e.g., silicone, rubber, plastic, composites, etc.) that enables it to be deformed without damage. The flexibility of the top and bottom walls enables the contents of content compartment 1400 to be ejected through nozzle 1406 by exerting pressure on the content compartment.

Top wall 1402-1 includes embedded strain sensor 1404, which provides an output signal when pressure is applied to content compartment 1400. In some embodiments, bottom wall 1402-2 also includes a strain sensor.

Dispense nozzle 1406 is a conventional port that enables passage of material out of content compartment 1400 but blocks passage of contaminants from the outside environment into the content compartment. In some embodiments, nozzle 1406 is reconfigurable to enable refilling of content compartment 1400. In some embodiments, nozzle 1406 is configured as a spray head and content compartment 1400 is operatively coupled with a pressurize source, such as compressed propellant.

In some embodiments, content compartment 1400 is configured to accept prepackaged content. For example, in some embodiments, content compartment 1400 is configured to accept an over-the-counter vapor source (e.g., nasal spray, etc.) contained in its own packaging. In some embodiments, content compartment 1400 is configured to accept and operably coupled with a different medicinal cartridge (e.g., a traditional inhaler, etc.).

Depending upon the application and the product to be dispensed, in some embodiments, a content compartment is reusable or disposable. In some embodiments, the entire case is disposable.

For many patients, such as chronic-disease patients, it is necessary to synchronize dosages of multiple medications, which represents a barrier to good adherence. For medications having similar dosing schedules, a dose of each can be sorted into the same dispensing site. For medications that are dosed differently, however, different doses can be sorted into different sites. For each scenario, smart cases in accordance with the present disclosure can be programmed to accommodate whatever prescription regimen is required, thereby enabling a patient on multiple medications to require only one case—a significant convenience.

It should be noted that, smart cases in accordance with the present disclosure designed for use with conventional blister cards (or other "push-through" formats) include dispense holes through which the medication is dispensed. In embodiments for use with loose pills that are sorted into individual sites (either manually or by self-assembly), however, such dispense holes would enable the pills to fall through the case bottom. In some embodiments, therefore, each of dispense holes 320 includes a barrier, such as a flap, that functions as a Reed-type check valve. Such barriers can be incorporated in case body 316 or substrate 502, or as a separate member.

Figure 15A:
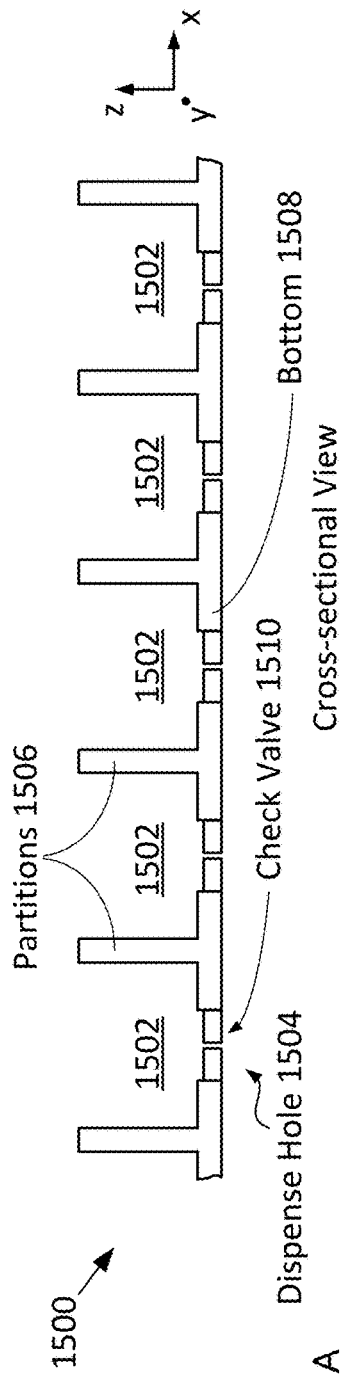
FIGS. 15A-B depict schematic drawings of cross-sectional and top views, respectively, of portions of an alternative content compartment that comprises check valves in accordance with the present disclosure.
Figure 15B:
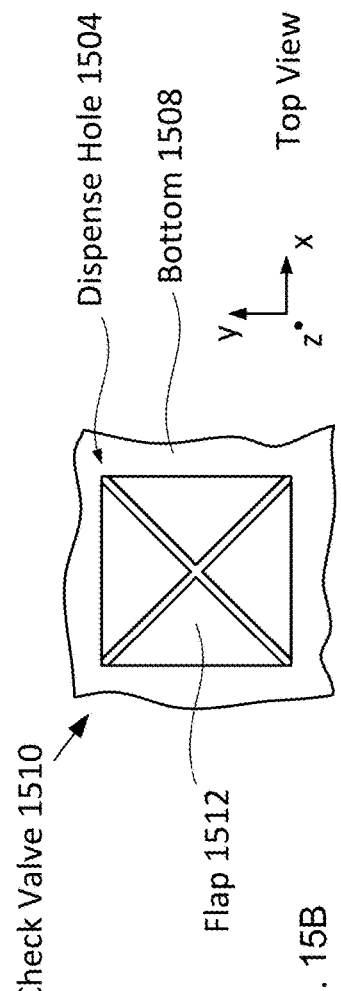

FIGS. 15A-B depict schematic drawings of cross-sectional and top views, respectively, of portions of an alternative content compartment that comprises check valves in accordance with the present disclosure. Content compartment 1500 includes a plurality of sub-compartments 1502 and a plurality of normally closed dispense holes 1504.

Each of sub-compartments 1502 is a chamber that is configured to hold tablets for one or more medications. Each of sub-compartments 1502 is defined by partitions 1506 and bottom 1508.

Each of dispense holes 1504 is centered in the bottom 1512 of a different sub-compartment 1502 and includes a check valve 1510 that provides a barrier suitable for retaining the contents in its respective sub-compartment until the user applies sufficient force to push the contents through the check valve.

Check valve 1510 is an arrangement of triangularly shaped resilient flaps 1512, which are substantially coplanar in the absence of a force applied by the user on the content located in its respective sub-compartment. In the depicted example, flaps 1512 comprise silicone; however, in some embodiments, flaps 1512 are made of a different resilient material.

The mechanical properties of the valve (and the compliance of the flaps) matters of design and are typically based on the size and geometry of dispense hole 1504, as well as the number and geometry, thickness, and materials of flaps 1512. Accordingly, the valve can be designed to allow a pill to be pushed through at a predetermined level of pressure/force, while securely preventing the pill from falling through the dispense hole under its own weight.

Content compartment 1500 provides reusable sites into which one or more pills can be placed to be dispensed by pushing them through when desired. The contents of a site can be pushed through by applying pressure/force directly onto it using, for example, a finger or stylus.

In some embodiments, content compartment 1500 is covered by a receiver whose corresponding site holes comprise elastically deformable membranes that isolate the pressure/force source from touching the content. Such a receiver can be configured to additionally aid in securing the contents of sites in place and can be reusable or disposable depending on the application and need.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A smart case (100) for monitoring the state of a content (1210) in a content compartment (1206), wherein the smart case comprises:
   (1) an electronics module (102); and
   (2) a detection module (104) that includes:
      (i) a housing (302) having a lid (318) and a body (316), wherein the lid is movable relative to the body;
      (ii) the content compartment, wherein the content compartment is reusable and configured to removably locate the content; and
      (iii) a sensor array (1208) that is operatively coupled with the content; wherein the electronics module includes electronic circuitry (112) that is configured to measure a first parameter across a portion of the content compartment.

2. The smart case of claim 1 wherein the sensor array includes a plurality of electrodes (1216) that is electrically coupled with the content, wherein the electronic circuitry is configured to generate a map of the first parameter by making pair-wise measurements of an electrical parameter among the electrodes of the plurality thereof, and wherein the electrical parameter is selected from the group consisting of resistance, impedance, and capacitance.

3. The smart case of claim 1 wherein the sensor array includes a plurality of electrodes (1216) that is electrically coupled with the content, and wherein the electronic circuitry is configured to generate a map of the first parameter within the content compartment by performing a measurement technique via the plurality of electrodes, the measurement technique being selected from the group consisting of electrical impedance tomography (EIT) and electrical capacitance tomography (ECT).

4. The smart case of claim 2 wherein the lid includes a first electrode of the plurality of electrodes.

5. The smart case of claim 2 wherein the content compartment includes a sidewall (1214) that includes a first electrode of the plurality of electrodes.

6. The smart case of claim 1 wherein the sensor array includes a plurality of electrodes that includes a first electrode (1306-1) and a second electrode (1306-2), and the content compartment includes a bottom (1212) that includes the first electrode and the lid includes the second electrode.

7. The smart case of claim 6 wherein the lid includes a plurality of lid sub-portions (1312) and at least one of the first electrode and second electrode includes a plurality of sub-electrodes (1306-1A through 1306-1C and/or 1306-2A through 1306-2C).

8. The smart case of claim 1 wherein the content compartment includes: a wall (1402) that is deformable; a nozzle that enables ejection of the content; and wherein the sensor array includes a strain sensor (1404) configured to provide an electrical signal in response to deformation of the wall, and wherein the first parameter is induced strain in the wall.

9. The smart case of claim 1 wherein the content compartment includes a plurality of sub-compartments (1502), each sub-compartment including: a dispense hole (1504); and a check valve (1510) for inhibiting the passage of the content through its respective dispense hole in the absence of pressure on the content.

10. The smart case of claim 1 wherein the content compartment includes at least one recess (1222) that is configured to locate at least a portion of the content.

11. The smart case of claim 1 further including a biosensor (348) that is configured to measure a user parameter selected from the group consisting of bio-impedance and bio-potential.

12. The smart case of claim 1 further comprising an environmental sensor (350) that provides an output signal based on at least one of an environmental factor and a user condition, wherein the electronics module is further configured to provide an alert to the user based on the output signal.

13. The smart case of claim 1 wherein the content compartment is configured to accept the content as contained in a peel-away blister pack.

14. The smart case of claim 1 wherein the housing has an open state that enables access to the content compartment and a closed state that prevents access to the content compartment, and wherein the housing includes: a catch (326) and a clasp (322), wherein at least one of the catch and clasp is electronically actuatable, and wherein the catch and clasp are configured to (1) engage and hold the housing in the closed state when the at least one of the catch and clasp is unactuated and (2) disengage and enable the open state when the at least one of the catch and clasp is actuated; and at least one of a camera (346) and a fingerprint sensor configured to acquire a user feature, the user feature being selected from the group consisting of a user image and a fingerprint; wherein the electronic circuitry is configured to disengage the catch and clasp and enable relative motion between the lid and the body based on the acquired user feature.

15. A method for monitoring the state of a content (1210) in a content compartment (1206), wherein the method comprises:
   (1) providing the content compartment such that it is reusable and configured to reversibly locate the content;
   (2) providing a sensor array (1208) that is operatively coupled with the content;
   (3) measuring a first parameter across a portion of the content compartment via the sensor array; and
   (4) estimating the state of the content based on the measured first parameter.

16. The method of claim 15 wherein the sensor array is provided such that it includes a plurality of electrodes (1216) that is operatively coupled with the content, and wherein the method further comprises: (5) performing pair-wise measurements of an electrical parameter between each pair of electrodes in the plurality thereof; and (6) generating a map of the measured first parameter over the portion of the content compartment, wherein the measured first parameter is based on the electrical parameter.

17. The method of claim 15 wherein the sensor array is provided such that it includes a plurality of electrodes (1216) that is operatively coupled with the content, and wherein the method further comprises (5) generating a map of the measured first parameter within the content compartment by performing a measurement technique via the plurality of electrodes, the measurement technique being selected from the group consisting of electrical impedance tomography (EIT) and electrical capacitance tomography (ECT).

18. The method of claim 15 wherein the sensor array is provided such that it includes a plurality of electrodes (1216) that is operatively coupled with the content, and wherein the lid comprises at least one electrode of the plurality thereof.

19. The method of claim 15 further comprising (5) providing a case (1200) comprising a housing (1202) that includes the content compartment, wherein the content compartment includes a sidewall, and wherein the sensor array is provided such that it includes a plurality of electrodes (1216) that is operatively coupled with the content, and wherein the sidewall comprises at least one electrode of the plurality thereof.

20. The method of claim 15 further comprising (5) providing a case (1300) comprising a housing (1202) that includes the content compartment, wherein the content compartment includes a bottom (1212), and wherein the sensor array is provided such that it includes a plurality of electrodes that includes a first electrode (1306-1) and a second electrode (1306-2), and wherein the bottom includes the first electrode and the lid includes the second electrode.

21. The method of claim 20 wherein the case is provided such that the lid includes a plurality of lid sub-portions (1312), and wherein the sensor array is provided such that at least one of the first electrode and second electrode includes a plurality of sub-electrodes (1306-1A through 1306-1C and/or 1306-2A through 1306-2C).

22. The method of claim 15 further comprising (5) providing a case (1200) comprising a housing (1202) that includes the content compartment, wherein the content compartment includes a wall (1402) that is deformable, and wherein the sensor array is provided such that it includes a strain sensor (1404) configured to provide the measured first parameter as a deformation of the wall.

23. The method of claim 15 further comprising:
   (5) providing an environmental sensor (350) that provides an output signal based on at least one of an environmental factor and a user condition; and
   (6) issuing an alert to the user based on the output signal.

24. The method of claim 15 further comprising:
   (5) providing a case (1200) comprising:
      (i) a housing (1202) that includes the content compartment, wherein the housing is controllable between an open state that enables access to the content compartment and a closed state that prevents access to the content compartment; and
      (ii) a sensor that includes at least one of a camera (346) and a fingerprint sensor, the sensor being configured to acquire a user feature that is selected from the group consisting of a user image and a fingerprint; and
   (6) controlling the state of the housing based on the acquired user feature.

\* \* \* \* \*